(12) United States Patent
Kanno et al.

(10) Patent No.: US 8,350,595 B2
(45) Date of Patent: Jan. 8, 2013

(54) SEMICONDUCTOR INTEGRATED CIRCUIT AND CONTROL METHOD FOR CLOCK SIGNAL SYNCHRONIZATION

(75) Inventors: Yusuke Kanno, Kodaira (JP); Makoto Saen, Kodaira (JP); Shigenobu Komatsu, Tachikawa (JP); Masafumi Onouchi, Higashimurayama (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/438,050

(22) Filed: Apr. 3, 2012

(65) Prior Publication Data
US 2012/0187993 A1    Jul. 26, 2012

Related U.S. Application Data

(62) Division of application No. 12/615,607, filed on Nov. 10, 2009, now Pat. No. 8,183,899.

(30) Foreign Application Priority Data

Nov. 11, 2008  (JP) ................................. 2008-288836

(51) Int. Cl.
*G01R 25/00* (2006.01)
*H03D 13/00* (2006.01)
(52) U.S. Cl. ................. 327/3; 327/7; 327/153; 327/161
(58) Field of Classification Search .................. 327/2, 3, 327/5, 7, 10, 12, 149, 153, 158, 161–163
See application file for complete search history.

(56) References Cited

U.S. PATENT DOCUMENTS

| | | | | |
|---|---|---|---|---|
| 5,825,209 | A | * | 10/1998 | Stark et al. ......................... 327/3 |
| 6,340,900 | B1 | * | 1/2002 | Donnelly et al. .................. 327/3 |
| 6,501,311 | B2 | | 12/2002 | Lutkemeyer |

(Continued)

FOREIGN PATENT DOCUMENTS

| JP | 2005-100269 A | 4/2005 |
|---|---|---|
| JP | 2006-041129 A | 2/2006 |
| JP | 2006-086455 A | 3/2006 |

OTHER PUBLICATIONS

Fujiyoshi et al., "A 63-mW H.264/MPEG-4 Audio/Visual Codec LSI With Module-Wise Dynamic Voltage/Frequency Scaling", IEEE Journal of Solid-State Circuits, vol. 41, No. 1, Jan. 2006, pp. 54-62.

(Continued)

*Primary Examiner* — Patrick O'Neill
(74) *Attorney, Agent, or Firm* — Miles & Stockbridge P.C.

(57) ABSTRACT

There is a need to ensure operation performance of a circuit region under DVFS control at low costs and highly precisely while a power-supply voltage change is made to the region. A first circuit (FVA) uses a first power-supply voltage (VDDA) for operation. A second circuit (NFVA) uses a second power-supply voltage (VDDB) for operation. A clock delay may be adjusted between paths for transmitting a clock to these circuits. When VDDA equals VDDB, a clock is distributed to FVA through a path that does not contain a delay device for phase adjustment. When the power-supply voltage for the FVA region is reduced, a clock is distributed to the FVA region based on a phase equivalent to one or two cycles of the clock displaced. Synchronization control is provided to synchronize clocks (CKAF and CKBF) and ensures operation so that a phase of two clocks to be compared fits in a range of design values while the power-supply voltage for the first circuit is changed.

2 Claims, 27 Drawing Sheets

U.S. PATENT DOCUMENTS

| | | | |
|---|---|---|---|
| 7,092,313 B2 | 8/2006 | Terazawa et al. | |
| 7,138,831 B2 | 11/2006 | Tobita | |
| 7,236,035 B2 | 6/2007 | Shiratake et al. | |
| 7,272,743 B2 | 9/2007 | Oikawa | |
| 7,737,740 B2 | 6/2010 | Millar et al. | |
| 8,183,899 B2 * | 5/2012 | Kanno et al. | 327/149 |
| 2009/0033155 A1 | 2/2009 | Kanno et al. | |

OTHER PUBLICATIONS

Kitahara et al., "Low-Power Design Methodology for Module-wise Dynamic Voltage and Frequency Scaling with Dynamic De-skewing Systems", 2006 IEEE 5D-1, pp. 533-540.

* cited by examiner (voltage change velocity of regulator)

(voltage variation of regulator)

$$Td = \frac{CgV}{Ids}$$

$$Ids = \beta(Vd-Vt)/2^{\alpha}$$

$$Td' = 2/\beta\ Cg(Vd-Vt)^{-\alpha-1}\{(1-\alpha)Vd-Vt\}$$

(gate delay voltage dependency of transistor)

normal operation

DVFS operation

| SCMP11 | SCMP12 | delay variation for next cycle | WINDLY for next cycle |
|---|---|---|---|
| H | H | P + r0 | Q − r2 |
| H | L | P | Q − r3 |
| L | L | P − r1 | Q − r4 |
| L | H | P | Q + r5 |

| ADDRESS | CDLYC | FDLYC | WINCTL | LOCK? |
|---|---|---|---|---|
| 0x0000 | 40 | 13 | 6 | Yes |
| 0x0001 | 40 | 12 | 6 | Plus |
| 0x0002 | 40 | 8 | 6 | Plus |
| 0x0003 | 40 | 3 | 6 | Yes |
| 0x0004 | 39 | 14 | 7 | Yes |
| ... | ... | ... | ... | ... |

| ADDRESS | CDLYC | FDLYC | WINCTL | LOCK? |
|---------|-------|-------|--------|-------|
| 0x0000  | 40    | 8     | 6      | Yes   |
| 0x0001  | 40    | 3     | 6      | Yes   |
| 0x0002  | 39    | 14    | 7      | Yes   |
| 0x0003  | 39    | 8     | 7      | No    |
| ...     | ...   | ...   | ...    | ...   |

SEMICONDUCTOR INTEGRATED CIRCUIT AND CONTROL METHOD FOR CLOCK SIGNAL SYNCHRONIZATION

CROSS-REFERENCE TO RELATED APPLICATIONS

This application is a division of application Ser. No. 12/615,607 filed Nov. 10, 2009 now U.S. Pat. No. 8,183,899. The present application also claims priority from Japanese patent application JP 2008-288836 filed on Nov. 11, 2008, the content of which is hereby incorporated by reference into this application.

FIELD OF THE INVENTION

The present invention relates to a clock signal synchronization technology for semiconductor integrated circuits. More particularly, the invention relates to a technology usefully applicable to not only system LSI and microprocessors for portable devices but also DVFS control in data processing systems, for example.

BACKGROUND OF THE INVENTION

Decreasing a power-supply voltage effectively reduces power consumption of a semiconductor integrated circuit. This is because power consumption of a transistor included in a semiconductor can be reduced in proportion to the square of the power-supply voltage. Further, a switching operation speed (operating frequency) of the transistor is approximately proportional to the power-supply voltage. There may be a case where the logic circuit does not require a high operating frequency. In such case, decreasing the power-supply voltage and the operating frequency effectively reduces power consumption of the semiconductor integrated circuit. This is known as the Dynamic Voltage and Frequency Scaling (DVFS) controls technology.

While the DVFS control is very effective for low-power consumption, installing this technology on a chip causes various problems. The problems include a method of transmitting signals between a DVFS control region and the other power supply regions when the DVFS control is used for part of power supply regions in the chip. Generally, as mentioned above, a variation in the power-supply voltage almost linearly varies the operating frequency of the transistor. An inverse of this frequency is equivalent to the signal propagation delay time of the transistor. The signal propagation delay time of the transistor is inversely proportional to the power-supply voltage. A variation in the power-supply voltage due to the DVFS control greatly varies operating speeds of the DVFS control region and the other regions and is incapable of a synchronization design presently widely used for signal exchange.

An important promising technology for synchronization is applied to clock signals distributed to the DVFS control region and the other regions and synchronizes phases of the clock signals at the corresponding nodes. The synchronization design can eliminate the wait time (latency) for signal exchange as a disadvantage of asynchronous designs and simplifies a protocol for exchanging signals. For example, Non-patent Documents 1 and 2, Patent Documents 1, 2, and 3 describe the synchronization design under the DVFS control.

Non-patent Document 1: Toshihide Fujiyoshi, Shinichro Shiratake, Shuou Nomura, et al., "A 63-mW H.264/MPEG-4 Audio/Visual Codec LSI With Module-Wise Dynamic Voltage/Frequency Scaling", IEEE JOURNAL OF SOLID-STATE CIRCUITS, VOL. 41, No. 1, January 2006, pp 54-62.

Non-patent Document 2: Takeshi Kitahara, Hiroyuki Hara, Shinichiro Shiratake, et al., "Low-Power Design Methodology for Module-Wise Dynamic Voltage and Frequency Scaling with Dynamic De-skewing Systems", 2006 IEEE 5D-1 pp 533-540.

Patent Document 1: Japanese Unexamined Patent Publication No. 2006-041129

Patent Document 2: Japanese Unexamined Patent Publication No. 2006-086455

Patent Document 3: Japanese Unexamined Patent Publication No. 2005-100269

SUMMARY OF THE INVENTION

Low-voltage control needs to be used actively so as to maximize the low power consumption effect of the DVFS control. In this case, changing the power-supply voltage consumes long time due to small power-supply impedance. Operations need to be inactive during this period so as to ensure the synchronization, greatly degrading the performance. Accordingly, the DVFS control requires to minimize a period for inactivating the system. The DVFS control improves the low power consumption effect as a voltage difference increases. However, the inventors found that the known examples described in Non-patent Documents 1 and 2 make it difficult to increase a difference between operating voltages to be varied. Increasing an operating voltage difference, if possible, may increase an area and degrade the comparison precision.

It is an object of the present invention to provide a small-size and low-cost semiconductor integrated circuit and a data processing system using the same capable of preventing operation performance of a circuit region under DVFS control from being degraded during a power-supply voltage change operation for that region and capable of widening an available operating voltage range.

These and other objects and novel features of the invention may be readily ascertained by referring to the following description and appended drawings.

The following summarizes representative aspects of the present invention disclosed in the specification.

A first circuit uses a first power-supply voltage for operation. A second circuit uses a second power-supply voltage for operation. Clock synchronization control is provided to perform clock delay adjustment between paths for transmitting clocks to these circuits and synchronize both clocks. Under the clock synchronization control, voltage change control is preceded by a change in a phase of the clock for the voltage to be changed as much as one or two cycles of the clock. The phase is aligned relatively to the clock for the unchanged voltage and the voltage change control is provided thereafter. In addition, a dynamic comparator is used to compare a clock to be distributed to the first circuit and a clock to be distributed to the second circuit.

The following summarizes an effect resulting from the representative aspects of the present invention disclosed in the specification.

It is possible to prevent a situation of degrading operation performance of a semiconductor integrated circuit under DVFS control at low costs.

DETAILED DESCRIPTION OF THE PREFERRED EMBODIMENTS

1. Summary of the Preferred Embodiments

Figure 1:
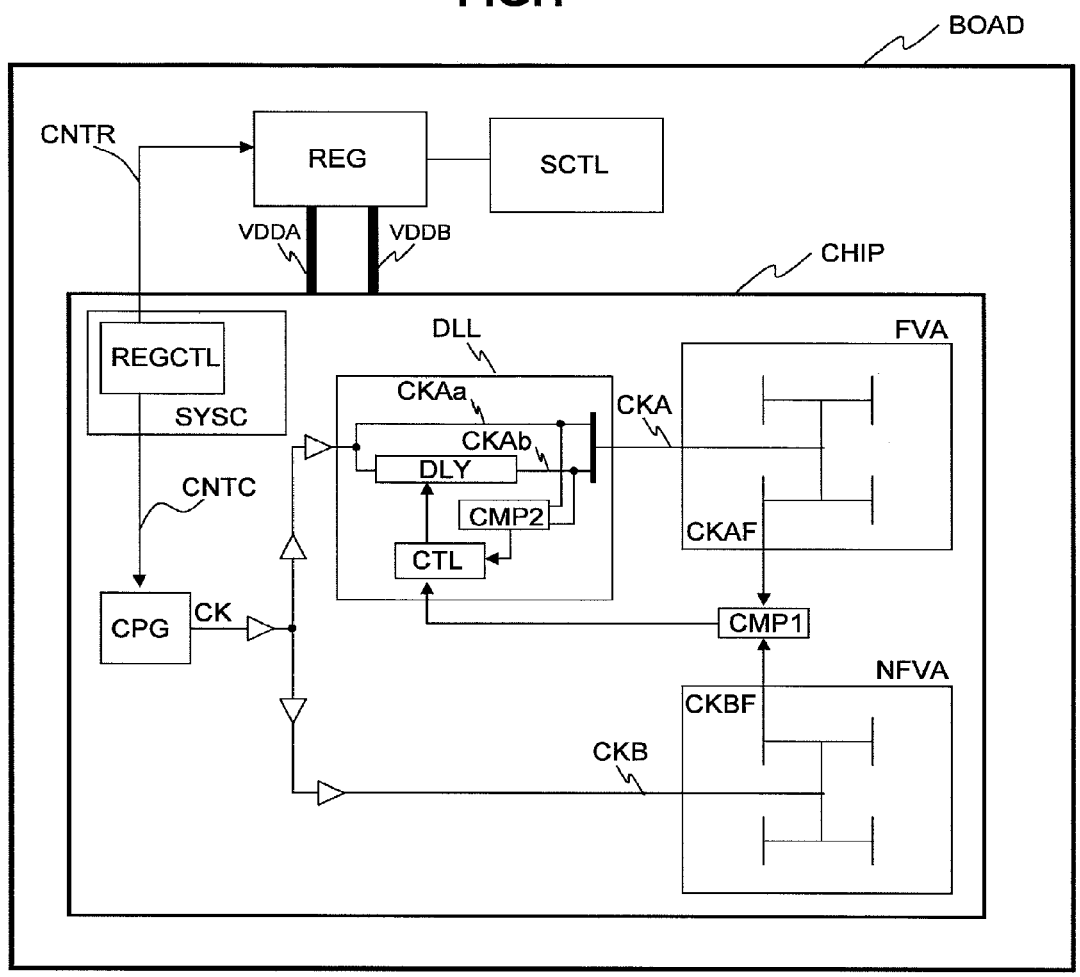
FIG. 1 is a block diagram showing a data processing system according to an embodiment of the invention.

The following provides a summary of the preferred embodiments of the invention disclosed in this specification. The summary of the preferred embodiments contains parenthesized reference numerals with reference to the drawings. The reference numerals just show examples belonging to the concept of the components to which the reference numerals are assigned.

<1> (Cooperation with Power Supplying LSI)

A semiconductor integrated circuit according to the invention includes: a first circuit that operates using a first power-supply voltage supplied from a power supplying LSI; a second circuit that operates using a second power-supply voltage; a clock generation circuit that generates a clock signal; a clock tree that transmits a clock generated by the clock generation circuit to the first circuit and the second circuit; a clock synchronization circuit having a plurality of delay stages that perform clock delay adjustment between a path for transmitting a clock to the first circuit and a path for transmitting a clock to the second circuit along the clock tree to synchronize both clocks; and a control circuit that notifies the power supplying LSI of change control over the first power-supply voltage. The power supplying LSI is notified of a voltage change velocity for applying variable control to the first power-supply voltage in accordance with a voltage and a process condition. Control is performed to match a phase between a clock supplied to the first circuit and a clock supplied to the second circuit when a voltage of the first circuit is changed at the voltage change velocity.

<2> (Multi-Cycle)

In the semiconductor integrated circuit according to item 1, the clock synchronization circuit includes: a second comparison circuit for comparing a phase between a clock output from the variable delay circuit and a clock propagated along a through path; and a delay control circuit for controlling a delay setting provided by the variable delay circuit. Based on a comparison result from the second comparison circuit, the delay control circuit set a delay equivalent to an integral multiple of a clock cycle to an output from the variable delay circuit in accordance with the clock propagated along the through path. The delay control circuit responds to an instruction to change the first power-supply voltage from a standard voltage to another voltage. The delay control circuit allows a selection circuit to select an output from the variable delay circuit and adjusts a delay setting by the variable delay circuit based on a comparison result from a first comparison circuit. The delay control circuit controls phase synchronization between a clock transmitted to the first circuit and a clock transmitted to the second circuit.

<3> (Dynamic Comparator)

In the semiconductor integrated circuit according to item 1, the first comparison circuit is a dynamic comparator that uses one clock as an activation signal for a differential input stage, differentially amplifies another clock based on a reference voltage equivalent to half a drive voltage for the relevant clock, and senses and latches a differential amplification result.

<4> (Pulse Latch Level Shifter)

In the semiconductor integrated circuit according to item 1, a level converting circuit is provided for a signal line that transmits information between the first circuit and the second circuit. The level converting circuit includes a clocked inverter and a latch circuit. An output terminal of the clocked inverter circuit is coupled to an input terminal of the latch circuit. The clocked inverter circuit includes a series circuit having a pair of p-channel MOS transistors and a pair of n-channel MOS transistors. A signal is input to a common gate of one p-channel MOS transistor and one n-channel MOS transistor. A clock is supplied to a gate of the other p-channel MOS transistor. An inverted clock of the clock is supplied to a gate of the other n-channel MOS transistor. The latch circuit is latched in accordance with a cutoff state of the other p-channel MOS transistor and n-channel MOS transistor.

<5> (Clock Gating)

In the semiconductor integrated circuit according to item 1, the first circuit further includes: a clock gate circuit that selectively prevents a clock propagated along the clock tree from being output to a subsequent stage; and a clock replica circuit that branches from before the clock gate circuit and propagates the clock to simulate a clock delay from the clock gate circuit to a node. The first comparison circuit compares a phase between a clock transmitted to the clock replica circuit and a clock transmitted to the second circuit.

<6> (Power-Supply Voltage Change Means)

A control method for clock signal synchronization according to the invention performs, in a semiconductor integrated circuit comprising a first circuit using a first power-supply voltage for operation and a second circuit using a second power-supply voltage for operation, clock delay adjustment between a path for transmitting a clock to the first circuit and a path for transmitting a clock to the second circuit along a clock tree for transmitting a clock to the first circuit and the second circuit and synchronizes both clocks. The method comprises: a voltage change process of changing the first power-supply voltage using a control circuit; and a clock synchronization process of controlling clock synchronization by performing the clock delay adjustment during the voltage change process.

<7> In the control method for clock signal synchronization according to item 6, the clock synchronization process includes: a first comparison process of comparing a phase between a clock transmitted to the first circuit and a clock transmitted to the second circuit; and first delay adjustment process of performing the clock delay adjustment using a phase comparison result from the first comparison process.

<8> (Clock Distribution Path Change Under DVFS Control and Otherwise)

In the control method for clock signal synchronization according to item 6, the semiconductor integrated circuit provides a clock synchronization circuit for a path for transmitting a clock to the first circuit. The clock synchronization circuit includes: a variable delay circuit for assigning a delay to an input clock; a through path for letting an input clock pass through without assigning a delay; and a selection circuit for selecting one of a clock output from the variable delay circuit and a clock output from the through path. The selection circuit selects the through path when the first power-supply voltage is a standard voltage. The selection circuit selects an output from the variable delay circuit when the first power-supply voltage is not a standard voltage.

<9> (Control Method for Voltage Change)

In the control method for clock signal synchronization according to item 6, the clock synchronization process includes: a second comparison process of comparing a phase between a clock output from the variable delay circuit and a clock propagated along the through path; and a second delay setting process using a comparison result from the second comparison process and setting a delay equivalent to an integral multiple of a clock cycle to an output from the variable delay circuit in accordance with the clock propagated along the through path. The first delay setting process includes: a process of allowing the selection circuit to select output from the variable delay circuit in response to an instruction to change the first power-supply voltage from a standard voltage to another voltage, adjusting a delay setting by the variable delay circuit based on a comparison result from the first comparison process, and controlling phase synchronization between a clock transmitted to the first circuit and a clock transmitted to the second circuit.

<10> A semiconductor integrated circuit according to the invention includes a phase comparison circuit that compares a phase between first and second clocks provided with different signal amplitudes. The phase comparison circuit uses a first clock as an activation signal for a differential input stage, differentially amplifies a second clock based on a reference voltage equivalent to half a drive voltage for the relevant clock, and senses and latches a differential amplification result.

<11> The semiconductor integrated circuit according to item 10 further includes: a first circuit using a first power-supply voltage for operation; and a second circuit using a second power-supply voltage for operation. The semiconductor integrated circuit uses a comparison result from the phase comparison circuit, performs clock delay adjustment between a path for transmitting a clock to the first circuit and a path for transmitting a clock to the second circuit along a clock tree for transmitting a clock to the first circuit and the second circuit, and synchronizes both clocks.

<12> The semiconductor integrated circuit according to item 11 further includes a level converting circuit provided along a signal line for information transmission between the first and second circuits. The level converting circuit includes a clocked inverter and a latch circuit. An output terminal of the clocked inverter circuit is coupled to an input terminal of the latch circuit. The clocked inverter circuit includes a series circuit having a pair of p-channel MOS transistors and a pair of n-channel MOS transistors. A signal is input to a common gate of one p-channel MOS transistor and one n-channel MOS transistor. A clock is supplied to a gate of the other p-channel MOS transistor. An inverted clock of the clock is supplied to a gate of the other n-channel MOS transistor. The latch circuit is latched in accordance with a cutoff state of the other p-channel MOS transistor and n-channel MOS transistor.

<13> The semiconductor integrated circuit according to item 1 further branches a clock distributed to the second circuit into a third clock signal passing through a delay circuit and a fourth clock signal not passing through a delay circuit immediately before comparison with a clock for the first circuit. The semiconductor integrated circuit further includes: a third comparator that compares a phase between a clock distributed to the first circuit and the third clock; a fourth phase comparator that compares a phase between a clock distributed to the first circuit and the fourth clock; and a delay change table. Delay stage control is provided to control a delay variation at a next cycle and a comparison time interval for the third and fourth comparators at a next cycle in accordance with a comparison result from the third and fourth phase comparators and data maintained in the delay stage change table.

<14> In the semiconductor integrated circuit according to item 13, the delay stage control acquires information about starting or stopping a voltage change from a first external voltage regulator and, during a voltage change, changes the number of delay stages in accordance with a delay stage variation maintained in a second delay stage change table.

<15> The semiconductor integrated circuit according to item 14 further includes a feature for determining whether or not a given phase difference is ensured between the third clock and the fourth clock. When the difference is not ensured, the feature maintains chronological relative relation between the third and fourth clocks as phase information in the second delay stage change table and corrects a delay stage variation maintained in a delay stage change table based on phase information maintained in the second delay stage change table.

<16> In the semiconductor integrated circuit according to item 14, delay stage control acquires and controls information about starting or stopping a voltage change from a voltage sensor provided inside an LSI.

<17> In the semiconductor integrated circuit according to item 13, the first and second circuits couple paths each having an equal latency up to clock tree nodes inside the circuits to the first and second phase comparators.

<18> In the semiconductor integrated circuit according to claim 13, the first and second circuits couple communicating paths to the first and second phase comparators.

2. Further Detailed Description of the Preferred Embodiments

Embodiments of the present invention will be described in further detail with reference to the accompanying drawings. Throughout all the drawings for illustrating the embodiments, elements having the same function are designated by the same reference numerals and a detailed description is omitted for simplicity.

FIG. 1 is a block diagram showing a data processing system according to an embodiment of the invention. For example, the data processing system includes a system board BOAD mounted with a power supply IC (regulator) REG, a semiconductor chip CHIP as a semiconductor integrated circuit, and a passive device for embodying the present invention. The invention ensures continued data processing operations of the semiconductor chip CHIP even when the DVFS control causes the power-supply voltage to change. In this case, the quantity of change made to the power-supply voltage is a very important factor. Provision of the passive device is one method of controlling voltage variations.

Depending on internal operational situations, the semiconductor chip CHIP controls a power-supply voltage supplied to the semiconductor chip CHIP and an operating frequency of the circuit. A control circuit REGCTL provides this control. The control circuit REGCTL is included in an integrated controller SYSC. When the information processing quantity becomes low in the semiconductor chip CHIP, for example, the control circuit REGCTL uses a control signal CNTR to decrease the power-supply voltage and uses a control signal CNTC to decrease the frequency. To change the power-supply voltage, the control circuit REGCTL transmits a control signal CNTR to an external regulator REG and configures an operating power-supply voltage for the semiconductor chip CHIP. When the regulator REG is used to change voltages, it is desirable to provide a feature for controlling the voltage variation (voltage slew rate) per unit time. The power-supply voltage variation is important for the technology. To adjust the variation, a circuit SCTL is provided for adjusting the slew rate of an output voltage from the regulator REG. The circuit SCTL may include passive devices such as resistors and capacitors externally provided for the regulator REG. The regulator REG may be mounted with necessary passive devices. According to the invention, the power-supply voltage changes a propagation delay for the gate, as will be described later. Controlling the circuit SCTL further stabilizes operations.

At least two power supply regions are defined in the semiconductor chip CHIP according to the invention. One is a region FVA where the DVFS control is provided and a power-supply voltage VDDA is supplied. The other region is not subject to the DVFS control and is supplied with a power-supply voltage VDDB. The latter region is equivalent to the remainder of the inner region of the semiconductor chip CHIP except the region FVA. A clock pulse generator CPG generates a clock CK that is distributed to both regions to embody the design of synchronizing data exchange between the regions. When the clock is distributed to both regions, it is necessary to synchronize phases of clocks at a node of clock trees. The clock trees are contained in the circuit region FVA targeted for the DVFS control and the circuit region NFVA not targeted for the DVFS control. A node of these clock trees is provided with a comparison circuit CMP1 that compares phases of both clocks CKAF and CKBF. The delay-locked loop circuit DLL receives a comparison result from the comparison circuit CMP1 and adjusts the delay quantity of the clock CKA. The clock delay adjustment is applied to the clock CKA that is distributed to the region FVA targeted for DVFS. The reason follows. According to the invention, the DVFS control is applied to part of the semiconductor chip CHIP. In such case, the DVFS control is often applied to a small region in the semiconductor chip CHIP as a whole. The embodiment can use one delay adjustment circuit. This makes it possible to reduce the circuit scale and ensure a small area even when so many delay stages are needed. Basically, the DVFS control ensures low power consumption at the cost of throughput. It is inadvisable to increase uncertainties by providing an extra circuit for a portion that needs to ensure stable throughput, i.e., a clock distribution network at the region NFVA that does not change the power-supply voltage. The region NFVA is supplied with the clock CKB.

The following issue applies when a delay element is provided for the clock distribution network for which DVFS is used. The circuit block for the circuit region FVA subject to DVFS basically aims to reduce voltages. A reduction in the power-supply voltage increases signal propagation delays of transistors inside the region FVA subject to the DVFS control. The invention synchronizes all clock phases in the semiconductor chip CHIP while the standard voltage is applied. It is effective to equalize the quantity and the size of devices or wiring loads for the clock distribution network so that influences of various uncertainties may be equalized. This condition is premised to design the distribution of clocks over the entire semiconductor chip CHIP. Reducing the voltage decreases the electric potential in the DVFS control region FVA and increases a delay for a clock distribution circuit in the DVFS control region FVA. The delay increase needs to be corrected. The voltage reduction control over the FVA region needs to increase the delay length of the clock CKA distributed to the FVA region so as to be equal to the integral multiple of the clock wavelength. The control then needs to be provided so as to decrease the number of delay devices that continue to be supplied with a given voltage in accordance with the voltage reduction. This is because minimal elements are used when the standard voltage is applied. There are no delay devices that can be eliminated in order to reduce the FVA region voltage. To solve this problem, the normal state uses a path CKAa to distribute a clock signal in accordance with the normal design without the use of extra delay devices. When the DVFS control is provided, a path CKAb is used to configure the clock distribution network provided with an additional delay sequence that delays the clock phase one or two cycles. This makes it possible to adjust a delay in the clock CKA distribution network even when the voltage is changed. It is possible to extend a state that matches phases for the clocks CKAF and CKBF. An inactive state can be reduced. A comparison circuit CMP2 compares phases when CKAa is changed to CKAb, or vice versa. The control circuit CTL receives the comparison result. A delay line DLY as a variable delay circuit adjusts the delay amount. Switching between CKAa and CKAb may interlock with clock CK frequency switching on a clock frequency adjustment circuit CPG. This makes it possible to decrease a period during which the clock distribution is inactive.

Figure 2A:
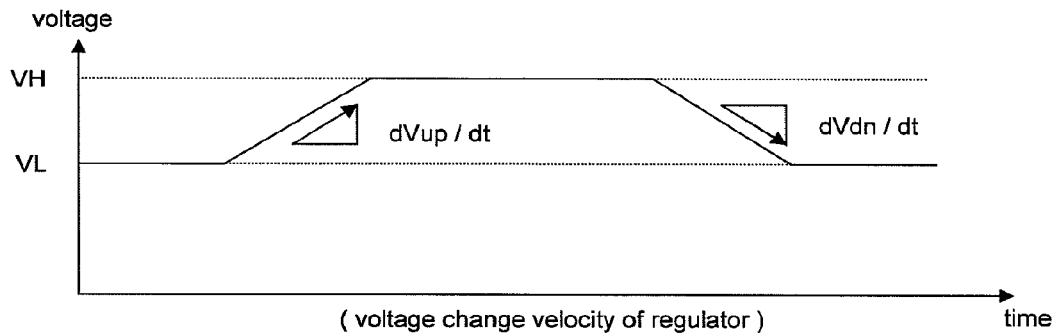
FIGS. 2A, 2B, and 2C show definition of a voltage variation.
Figure 2B:
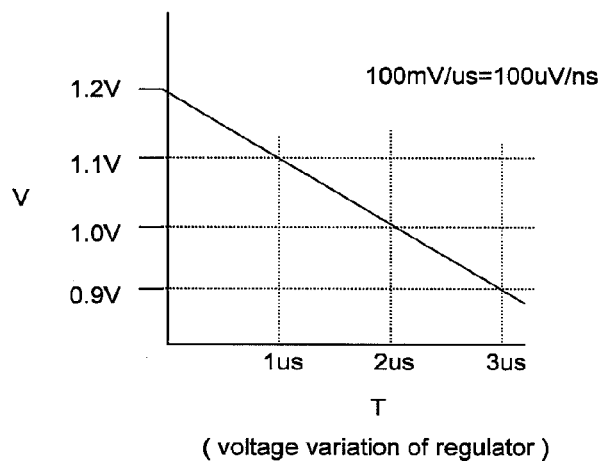
Figure 2C:
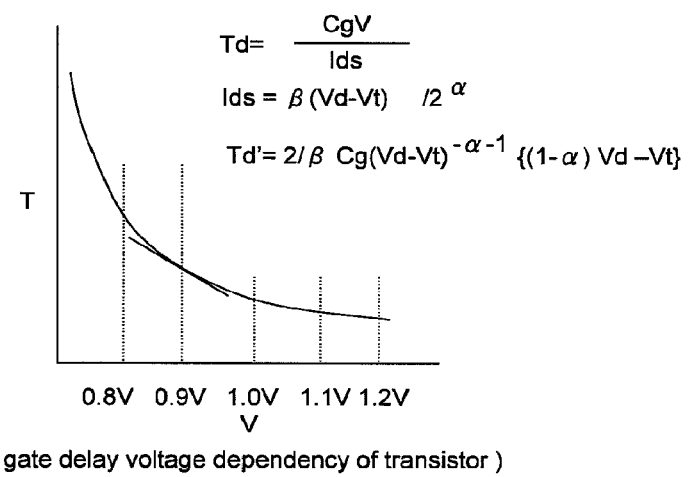

FIGS. 2A, 2B, and 2C show definition of a voltage variation. As shown in FIG. 2A, the power-supply voltage variation is represented by voltage rise velocity dVup/dt and voltage drop velocity dVdn/dt. The passive device in the circuit SCTL shown in FIG. 1 can be used to change these values.

The following describes a delay variation in the clock distribution network due to a voltage change. As shown in FIG. 2C, transistor Ids is given as follows.

$$Ids = \beta/2 * (Vds - Vt)^{\alpha} \quad (1)$$

where $\alpha$ represents a numeric value of approximately 1.3 for a microfabrication process and $\beta$ represents mobility. A transistor propagation delay is expressed as follows.

$$Td = Cg * VDD/Ids = Cg * VDD/(A * (Vds - Vt)^{\alpha}) \quad (2)$$

Given Vds=VDD, the velocity change ratio is expressed as follows.

$$dTd/dVDD = 2 * Cg * VDD/\beta * (VDD - Vt)^{(-\alpha-1)} \{(1-\alpha)VDD - Vt\} \quad (3)$$

When a DLL control time (Tctl) is spent to compare phases in the comparison circuit CMP2, change to the delay sequence, and re-compare the change result, the voltage variation during this time is expressed as follows.

$$\Delta V = dVup/dt * Tctl \text{ (or } \Delta V = dVdn/dt * Tctl) \quad (4)$$

The delay amount variation due to this potential difference is expressed as follows.

$$\Delta T = 2 * Cg * VDD/\beta * (VDD - Vt)^{(-\alpha-1)} \{(1-\alpha) * VDD - Vt\} * dVup/dt * Tctl \quad (5)$$

$$(\text{or } \Delta T = 2 * Cg * Vds/\beta * (VDD - Vt)^{(-\alpha-1)} \{(1-\alpha) * VDD - Vt\} * dVdn/dt * Tctl)$$

The delay-locked loop circuit DLL needs to maintain a clock phase smaller than or equal to a target value. To do this, the delay variation (5) during the Tctl period needs to satisfy a target specification with a sufficient tolerance. When using specific values for the computation, a voltage variation of the regulator is assumed to be 100 mV/us=100 uV/ns as shown in FIG. 2B, and the Tctl period is assumed to be 15 ns, i.e., equivalent to three cycles at a 200 MHz operation clock. Further, it is assumed to use ten stages, i.e., N=10, for the clock distribution network in the region FVA subject to DVFS. Then, the delay variation is considered to range from several picoseconds to several tens of picoseconds per cycle. When a phase difference between two clocks is assumed to approximate 100 ps, the phases of two clocks can be fully synchronized in accordance with the power-supply voltage variation.

There may be provided a means for changing this voltage change velocity in accordance with process conditions and a power-supply voltage value at the beginning of voltage change and notifying an external power supply IC of the voltage change velocity. It is expected to improve the clock phase control accuracy.

Figure 3:
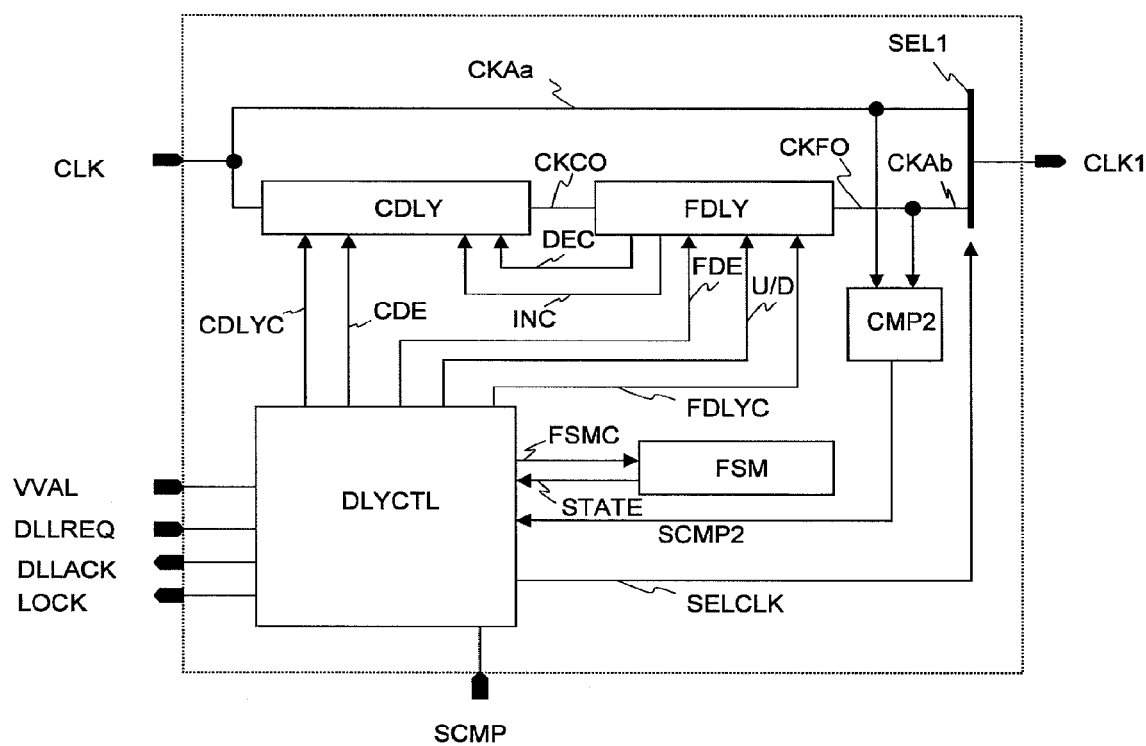
FIG. 3 is a block diagram exemplarily showing configuration of a delay change circuit in a delay-locked loop circuit DLL.

FIG. 3 exemplarily shows the configuration of the delay change circuit in the delay-locked loop circuit DLL. As mentioned above, the embodiment of the invention distributes the clock CLK into two paths. One is the path CKAa that distributes the clock without providing an extra delay. The other is the path CKAb that provides a delay equivalent to one cycle of clock or more for the DVFS control. The path CKAb adjusts the delay amount during a change operation of the delay-locked loop. The delay amount is adjusted to be greater than or equal to a propagation delay increase for the clock in the DVFS control region FVA at the lowest voltage under the DVFS control. A selector SELL selects the two-path clocks. The selected clock is distributed into the logic circuit. As an advantage, it is possible to design clock phases according to the static timing analysis (STA) and close the timing at the normal voltage without using the delay-locked loop. As will be described later, the selection control uses a control signal (SELCLK) generated from a control section DLYCTL when a phase difference between two clocks is within the design value. A delay-locked loop control section DLYCTL adjusts the delay amount from a finite state machine FSM, controls the state transition in the delay-locked loop, controls a clock phase comparator CMP2, and controls the selector SEL1. The delay-locked loop control section DLYCTL and the finite state machine FSM are equivalent to the control section CTL in FIG. 1. CDLY and FDLY are equivalent to DLY in FIG. 1.

The delay-locked loop control section DLYCTL receives current voltage information VVAL and a DLL control start signal DLLREQ from the integrated controller SYSC mounted on the semiconductor chip CHIP to start the delay-locked loop operation. The voltage information VVAL indicates the type of voltage supplied as a power-supply voltage ADDA to the region FVA. The information identifies the standard voltage or a lower voltage such as a low-power voltage. The signal DLLREQ goes high when SYSC issues a control request to the delay-locked loop circuit DLL. The delay-locked loop control section DLYCTL receives the signal DLLREQ to operate the delay-locked loop circuit DLL. When the delay-locked loop circuit DLL starts to operate, for example, a DLL acknowledge signal DLLACK may be raised to a high level to notify SYSC that the delay-locked loop circuit has started to operate. When receiving the signal notifying that the delay-locked loop circuit DLL has started to operate, the delay-locked loop control section DLYCTL uses a signal FSMC to control the finite state machine FSM that manages delay-locked loop control states.

The embodiment of the invention may provide two modes of delay-locked loop circuit operations. The first mode provides control for switching between CKAa and CKAb at the normal voltage. In the normal state, as mentioned above, it is effective to distribute the clock to CKAa containing no extra delay for the purpose of reducing the power consumption and design variations. The DVFS control needs to change the delay length. The clock then needs to be distributed to CKAb that contains an extra delay. The CKAb clock distribution network includes a coarse adjustment delay circuit CDLY and a fine adjustment delay circuit FDLY. For ease of control, all delay variations for the fine adjustment delay circuit FDLY are configured to be equivalent to one stage of the coarse adjustment delay circuit CDLY. The delay time is divided by the power of two.

Phases of the paths CKAa and CKAb need to be aligned prior to changeover from the path CKAa to the path CKAb, or vice versa. The comparator CMP2 is used for the phase alignment. To adjust phases, the control signal CDLYC allows the coarse adjustment delay circuit CDLY to adjust the delay amount. That is, the value of the control signal CDLYC is changed so as to align with a phase equivalent to a specified cycle displaced from the output SCMP2 from the comparator CMP2. For ease of control, the delay adjustment preferably may use the maximum delay length. A circuit such as a process monitor or a temperature monitor, when used, makes it possible to select an optimal delay amount according to use conditions. After the phase adjustment on the coarse adjustment delay circuit CDLY, the fine adjustment delay circuit FDLY adjusts the phase.

The control circuit DLYCTL in the delay-locked loop circuit DLL transmits a lock signal LOCK to SYSC when the phase of clocks to be compared satisfies the design value. SYSC receives the lock signal LOCK and allows the selector SELL to change the clock distribution network. At this time, the frequency may be changed, as will be described later. When the frequency is changed, the clock distribution may be stopped temporarily. Also in such case, the clock distribution network is changed during the stop period.

The second mode provides delay-locked loop control when the power-supply voltage is changed for the DVFS control. In this case, the power-supply voltage is changed basically in units of one delay adjustment stage of the fine adjustment circuit.

A propagation delay of the transistor is represented in a monotonic function of the power-supply voltage. Accordingly, the following control is available. The delay amount is gradually increased when the voltage drops. The delay amount is gradually decreased when the voltage rises. The invention corrects a change in the delay amount of the clock distribution network due to a voltage change. To do this, as a basic operation, the fine adjustment delay circuit FDLY successively increases or decreases the delay amount to correct a delay variation. Due to capability limits, an extra amount may result from the fine adjustment delay circuit FDLY and is transmitted as carry control to the coarse adjustment delay circuit CDLY. The delay stages of the coarse adjustment delay circuit FDLY are then incremented or decremented by one. For this purpose, the control circuit DLYCTL supplies to the fine adjustment delay circuit FDLY, a control signal FDLYC for the fine adjustment delay circuit FDLY, a delay increase/decrease signal U/D, and a fine adjustment delay circuit enable signal FDE. The control circuit DLYCTL supplies the coarse adjustment delay circuit CDLY with a coarse adjustment delay circuit control signal CDLYC and a coarse adjustment delay circuit activation signal CDE. The fine adjustment delay circuit supplies the coarse adjustment delay circuit CDLY with a delay increment signal INC and a delay decrement signal DEC. The control circuit DLYCTL receives a state transition signal STATE from the state transition machine FSM and performs control. The control circuit DLYCTL receives phase information SCMP about the clock from the comparison circuit CMP1. Based on the information, the control circuit DLYCTL controls the fine adjustment delay circuit FDLY and the coarse adjustment delay circuit CDLY.

The control circuit DLYCTL provides necessary delay correction in accordance with comparison results from the clock phase comparison circuit CMP1 by successively reflecting the comparison results as follows. Based on the comparison result, an available method may set the fixed number of delay adjustment stages for the fine adjustment delay circuit FDLY and automatically change the number of delay stages in accordance with a voltage change. This method uses the characteristic that a delay monotonically varies with a power-supply voltage change.

Figure 4:
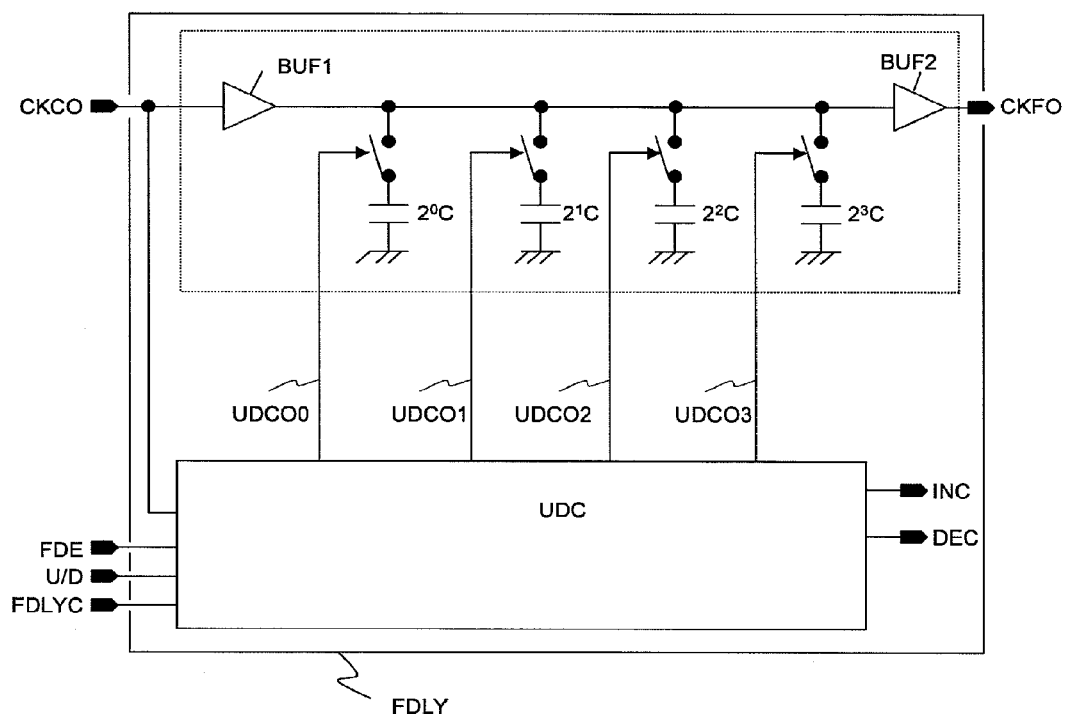
FIG. 4 is a circuit diagram exemplarily showing a fine adjustment delay circuit FDLY.

FIG. 4 exemplarily shows the fine adjustment delay circuit FDLY. The circuit adjusts a delay by controlling a wiring load sandwiched between buffers BUF1 and BUF2. The fine adjustment delay circuit FDLY can linearly change the delay amount by selectively coupling capacitor circuits $2^0C$ through $2^3C$ whose capacities differ from each other based on the power of two. It is preferable to use an up/down counter UDC for the delay change control. This is because the purpose is to ensure the clock synchronization while the power-supply voltage rises or drops. A monotonic function applies to the relation between the voltage change direction and the delay increase or decrease. When the control is performed to reduce the voltage, for example, the basic operation is to reduce the delay sequence. The up/down counter UDC includes a function of incrementing or decrementing the count value in accordance with a drive clock CLCO. The up/down counter UDC is appropriate for the control that monotonically increases or decreases the delay sequence. Obviously, for example, a voltage ripple occurs during the voltage change control. The precision control requires to measure a phase difference between two clocks and feedback the result. An average voltage monotonically increases or decreases when the control is provided to increase or decrease the voltage even though a voltage ripple or the like occurs. When the control feedback is time-consuming, it is effective to automatically increase or decrease a delay in accordance with the voltage change direction for the purpose of preventing a clock phase from being greatly displaced. The voltage control estimates a delay increase or decrease to automatically control the number of delay stages. The fine adjustment becomes available every cycle even when a long feedback is needed up to the delay control. It is desirable to design the voltage variation within a range with which the fine adjustment delay circuit FDLY can by synchronized. This is because a delay variation in the fine adjustment delay circuit FDLY is usually set to be sufficiently smaller than a target phase difference between two clocks to be adjusted.

It is desirable to change the delay amount at the rising edge of a clock that passes through a buffer stage to be switched. For this reason, the up/down counter UDC is synchronized with a clock CKCO at the exit of the coarse adjustment delay circuit CDLY. Normally, a clock is designed to incorporate data at the rising edge. When the delay change can be configured while the clock remains low, the delay change can take effect at the next rising edge.

It is desirable to design the up/down counter UDC based on an adder. This design permits operations of adding or subtracting any number of pieces of data up to the maximum value equivalent to the number of delay stages in the fine adjustment delay circuit FDLY rather than one piece of data at a time. There is provided an effect of improving the degree of control freedom. The circuit receives a fine adjustment delay circuit start signal FDE from the control section DLYCTL to start the fine adjustment delay circuit FDLY. A control signal from the control section DLYCTL can be also used to set the delay amount to be activated at a time. The circuit FDLY in FIG. 4 is configured to increase the capacitance series from the left based on the power of two. Switching UDCO0 through UDCO3 changes the delay amount. Successive switching from UDCO0 may change the minimum delay amount. Successive switching from UDCO1 may change the delay amount based on double the minimum delay amount. When an intended addition/subtraction constant is assigned to the up/down counter UDC, for example, a delay double the unit delay can be added or subtracted every time. The delay can be adjusted on a cycle basis by determining the number of delay adjustment stages and using the delay increment signal INC and the delay decrement signal DEC.

The delay increment signal INC and the delay decrement signal DEC are supplied from the up/down counter UDC and are transmitted to the coarse adjustment delay circuit CDLY. An embodiment of the invention is not limited to the above-mentioned technique and may use the other minute delay change circuit techniques.

Figure 5:
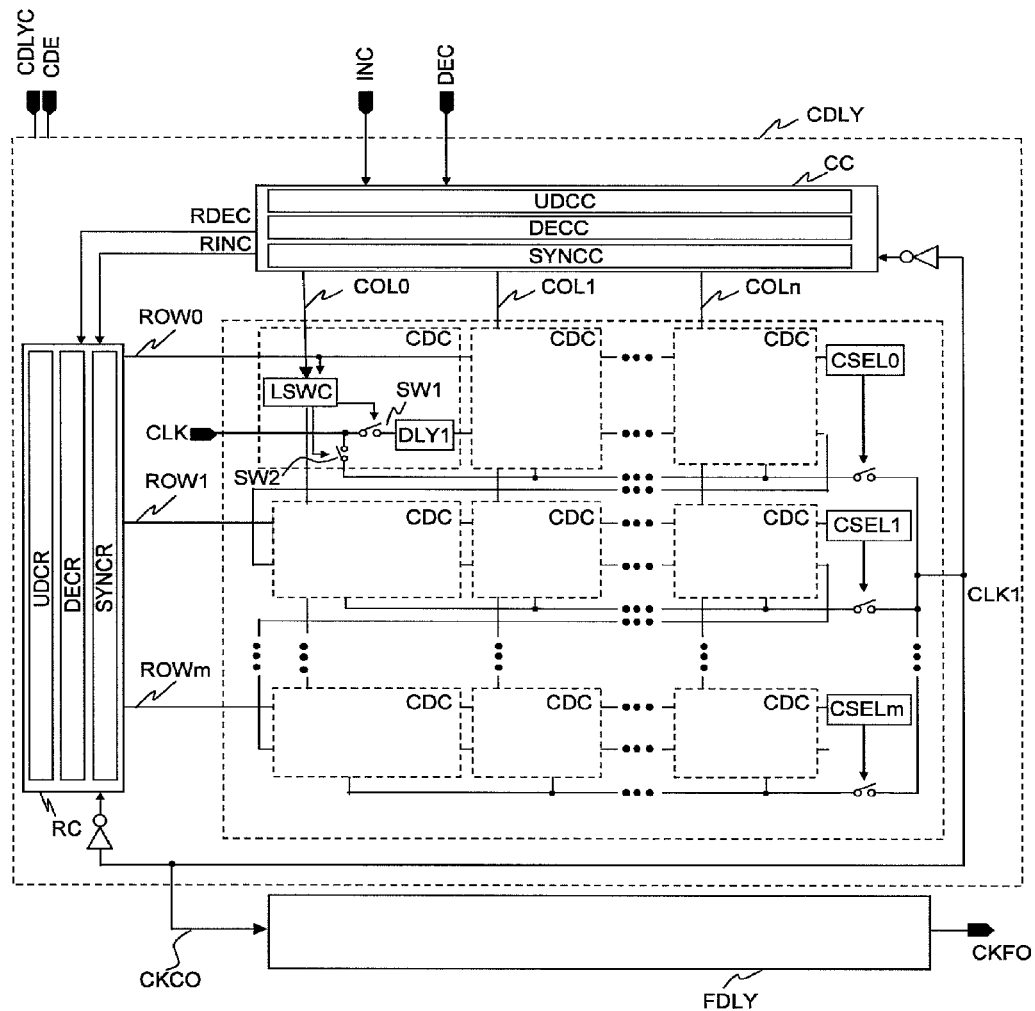
FIG. 5 is a circuit diagram exemplarily showing a coarse adjustment delay circuit.

FIG. 5 exemplarily shows an example of the coarse adjustment delay circuit CDLY. The delay-locked loop circuit DLL according to the invention requires a relatively long delay sequence. Multiple delay devices need to be used to align phases for generating the delay time exceeding one cycle of clock. The timing design is very difficult so as to be able to control a long delay based on fine adjustment and coarse adjustment in cooperation with each other. According to the invention, the coarse adjustment delay circuit CDLY is succeeded by the fine adjustment circuit FDLY. The delay sequence is switched over to one of both circuits at a coupling portion between a coarse adjustment delay and a fine adjustment delay. The clock delay sequence is preferably switched at physically close positions so as to simultaneously change the coarse adjustment delay circuit CDLY and the fine adjustment delay circuit FDLY. In addition, the hardware scale may become very large when a delay sequence is very long as described in the invention. This is because the delay circuit requires a flip-flop circuit in addition to a delay element circuit such as the buffer. The flip-flop circuit works as a synchronization circuit that synchronizes and incorporates a delay adjustment signal at a clock change point during the switchover control for changing the delay. For example, many flip-flops are needed to hold and output selection signals such as UDCO0 through UDCO3 in synchronization with the clock. The selection signals UDCO0 through UDCO3 are used to select capacitor device circuits as delay elements. The invention necessitates a long delay and causes a considerable area for flip-flops. It is necessary to decrease the number of flip-flops. To solve this problem, the delay sequence is two-dimensionally arrayed in a matrix state. A flip-flop for delay switchover is used as a pointer that specifies vertical and horizontal sequences. In this manner, the number of flip-flops can be approximately limited to the square root of the number of delay stages. This makes it possible to greatly decrease the percentage of the flip-flop area in the chip. FIG. 5 shows the example in consideration for this.

The coarse adjustment delay circuit CDLY in FIG. 5 includes a coarse adjustment delay array CDARY, a column direction control circuit CC, and a row direction control circuit RC. The coarse adjustment delay array CDARY contains coarse adjustment delay units CDCs formed in a matrix state. The column direction control circuit CC selects the last path column of the coarse adjustment delay units CDCs that propagate the clock CLK supplied to the coarse adjustment delay array CDARY. The row direction control circuit RC selects the last path row of the coarse adjustment delay units CDCs that propagate the clock CLK likewise. The column direction control circuit CC includes an up/down counter UDCC, a decoder circuit DECC, and a synchronization circuit SYNCC. The column direction control circuit CC outputs column direction selection signals COL0 through COLn for the coarse adjustment delay units CDCs. The row direction control circuit RC includes an up/down counter UDCR, a decoder circuit DECR, and a synchronization circuit SYNCR. The row direction control circuit RC outputs row direction selection signals ROW0 through ROWm for the coarse adjustment delay units CDCs. The value of the up/down counter UDCC is used to specify one of column direction selection signals COL0 through COLn as a selection level. Similarly, the value of the up/down counter UDCR is used to specify one of row direction selection signals ROW0 through ROWm as a selection level. The coarse adjustment delay array CDARY propagates the clock CLK up to a position selected by both selection signals through the coarse adjustment delay units CDCs to output a clock signal CLK1. The clock signal CLK1 is supplied to the fine adjustment delay circuit FDLY and is supplied as a synchronization clock between the column direction control circuit CC and the row direction control circuit RC. The up/down counters UDCC and UDCR contain preset counter values needed to provide the delay time specified by the coarse adjustment delay circuit control signal CDLYC. The preset count value is incremented in response to the delay increment signal INC and is decremented in response to the delay decrement signal DEC. The delay increment signal INC and the delay decrement signal DEC are supplied from the fine adjustment delay circuit FDLY. The up/down counter UDCC is incremented in response to the delay increment signal INC. Each time a carry is generated, a delay increment signal RINC increments the up/down counter UDCR. The up/down counter UDCC is decremented in response to the delay decrement signal DEC. Each time a borrow is generated, a delay decrement signal RDEC decrements the up/down counter UDCR. These processes a delay carry or borrow occurring in the fine adjustment delay circuit FDLY.

The coarse adjustment delay unit CDC includes switches SW1 and SW2, a switch control circuit LSWC, and a delay device DLY. The switch control circuit LSWC turns on SW1 and turns off SW2 when the corresponding column direction selection signal COLi and row direction selection signal ROWj are not selected. The switch control circuit LSWC turns off SW1 and turns on SW2 when the corresponding column direction selection signal COLi and row direction selection signal ROWj are selected. The SW2 is wire-ORed with an output node of the clock signal CLK1 via a row-based output switch SW3. Output selection circuits CSEL0 through CSELm turn on the output switch SW3 corresponding to a selection level indicated by the corresponding row direction selection signals ROW0 through ROWm.

The column direction control circuit CC will be described in more detail. FIG. 5 shows an example of n bits. The circuit receives the delay increment signal INC and the delay decrement signal DEC from the fine adjustment delay circuit FDLY and adjusts a delay sequence of the coarse adjustment delay circuit CDLY. The synchronization circuit SYNCC needs to synchronize signals COL0 through COLn coupled to local switches. Specifically, the circuit once synchronizes the signal at a clock corresponding to the falling edge of the delay sequence to be switched. Based on the result, the circuit controls the switches along the columns of the delay sequence. This aims to prevent the clock from being provided with an unnecessary signal when the coarse adjustment delay circuit is switched. On the delay-locked loop circuit DLL, the timing to adjust a clock phase is asynchronous with the timing to compare phases at the node. Insufficient investigation into the synchronization may provide the clock with an unexpected signal and cause the system to malfunction. Accordingly, a delay may be switched smoothly when data is settled a half cycle before validation of the delay change. When it is assume that a 200 MHz clock is to be synchronized, one cycle of the clock is 5 ns. A half cycle thereof is 2.5 ns. The logic circuit may be controlled to allow up to 2.5 ns as the delay time until the delay amount adjustment.

The following more specifically describes the carry and borrow features of the column direction control circuit CC and the row direction control circuit RC. The delay increment signal RINC is transmitted to a row direction delay control circuit RC when COLn is high (selection level) and the delay increment signal INC is high (increment activation). The delay decrement signal RDEC is transmitted to a row direction delay control circuit when COL0 is high (selection level) and the delay decrement signal DEC is high (decrement activation). The switch selection circuits CSEL0 through SELm select a clock selection switch to be coupled to the selected ROW.

The row direction control circuit RC will be described in more detail. Similarly to the column control circuit, the signals ROW0 through ROWm need to be synchronized. For example, flip-flops are used to synchronize the row direction control signals ROW0 through ROWm. In this example, a falling signal of CLK1 is used for synchronization. The synchronization signal has almost the same timing as the synchronization clock for the column direction control circuit CC. The column direction control circuit CC and the row direction control circuit RC can simultaneously set delays. A control signal supplied from the column direction control circuit CC is sufficiently fast transmitted to the row direction control circuit RC. No timing problem occurs.

Figure 6:
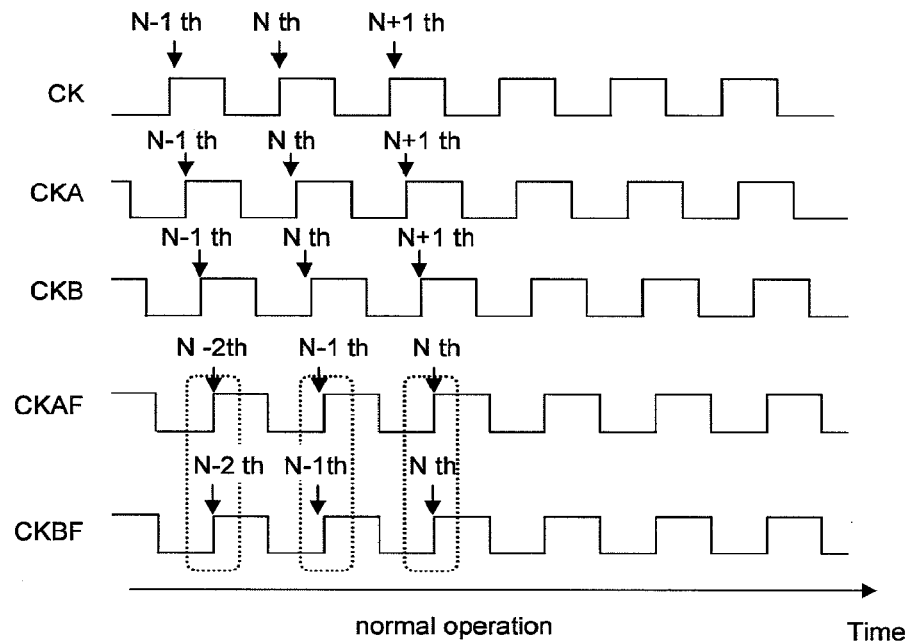
FIG. 6 is a timing chart showing the concept of clock phase focusing in terms of operations under normal voltage conditions.
Figure 7:
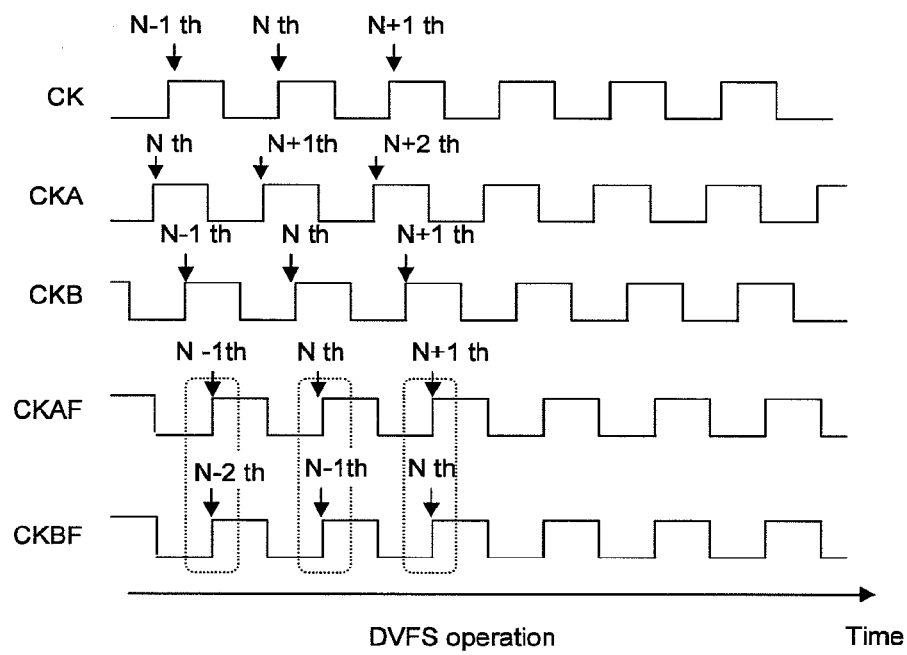
FIG. 7 is a timing chart showing the concept of operations to change a voltage for DVFS control region FVA.

FIGS. 6 and 7 diagram the concept of clock phase alignment. FIG. 6 shows an operation at normal voltage. In this case, there is a difference in the clock propagation delay amounts between the clock CK as a propagation source and the terminal clock CKAF or CKBF. The clocks CKA and CKAF belong to the region where the DVFS control is provided. The clocks CKB and CKBF belong to the region NFVA where the DVFS control is not provided. Control is performed to align phases of these clocks at the nodes CKAF and CKBF. It is also possible for both to adjust an absolute phase from a master oscillator for clocks. The drawing shows such state. In short, clocks are designed so as to align phases at CKAF and CKBF.

FIG. 7 shows the concept of operation when the voltage is changed for the DVFS control region FVA. Reducing the power supply voltage for the DVFS control region FVA requires control to increase a delay in the delay-locked loop circuit DLL in accordance with the voltage change. According to the invention, the DVFS control needs to delay a clock phase at least one cycle. As shown in FIG. 7, the number of delay stages is controlled so as to delay a phase of an output clock from the delay-locked loop circuit DLL. In terms of nodes, CKAF can be phase-aligned with CKBF one cycle later.

Figure 8:
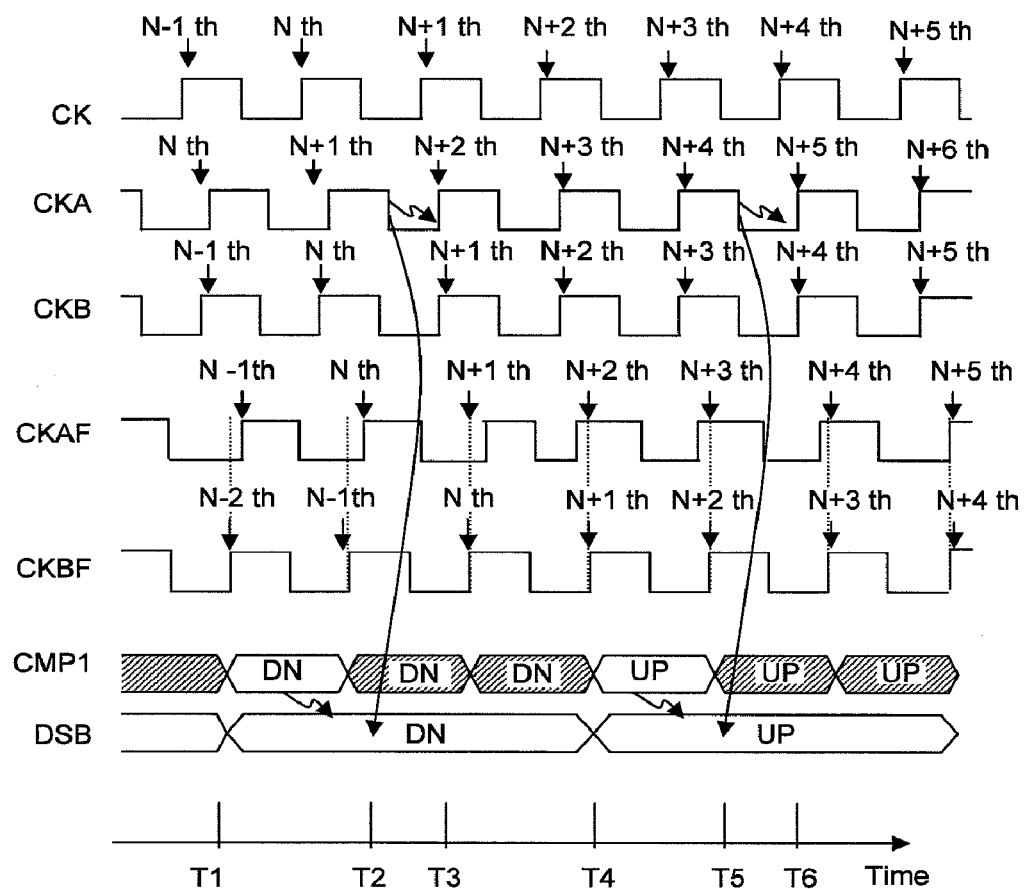
FIG. 8 is a timing chart showing transition of control operations on a delay-locked loop circuit DLL.

FIG. 8 shows transition of control operations on the delay-locked loop circuit DLL. CK denotes a clock as a clock distribution source. CKA denotes a clock for the DVFS control region FVA. CKB denotes a clock for the region NFVA where no voltage changes. CKAF and CKBF denote clocks at nodes corresponding to clocks to be distributed to respective blocks. In this example, the comparison circuit CMP1 compares CKAF and CKBF at time T1. The up/down counter UDC maintains delay unit selection information corresponding to the comparison result. At time T2, the control circuit DLYCTL incorporates phase information SCMP about the clock as a result of the comparison at time T1. An up/down signal U/D is then generated and is supplied to the up/down counter UDC. Synchronized with a falling signal of CKA, the selection signals UDCO0 through UDCO3 update selection of delay elements in the delay sequence. The updated delay takes effect at the next rising edge of CKA, i.e., time T3. The clock CKA reflects the delay update and reaches the node at time T4. The comparison circuit CMP1 again provides comparison control. The comparison result is incorporated at time T5 and takes effect at time T6. DSB denotes phase information SCMP about a clock that is incorporated and maintained in the control circuit DLYCTL.

The embodiment can provide the semiconductor integrated circuit that can continue synchronization while changing the power-supply voltage despite a very large difference between a voltage to be changed and an unchanged voltage.

Figure 9:
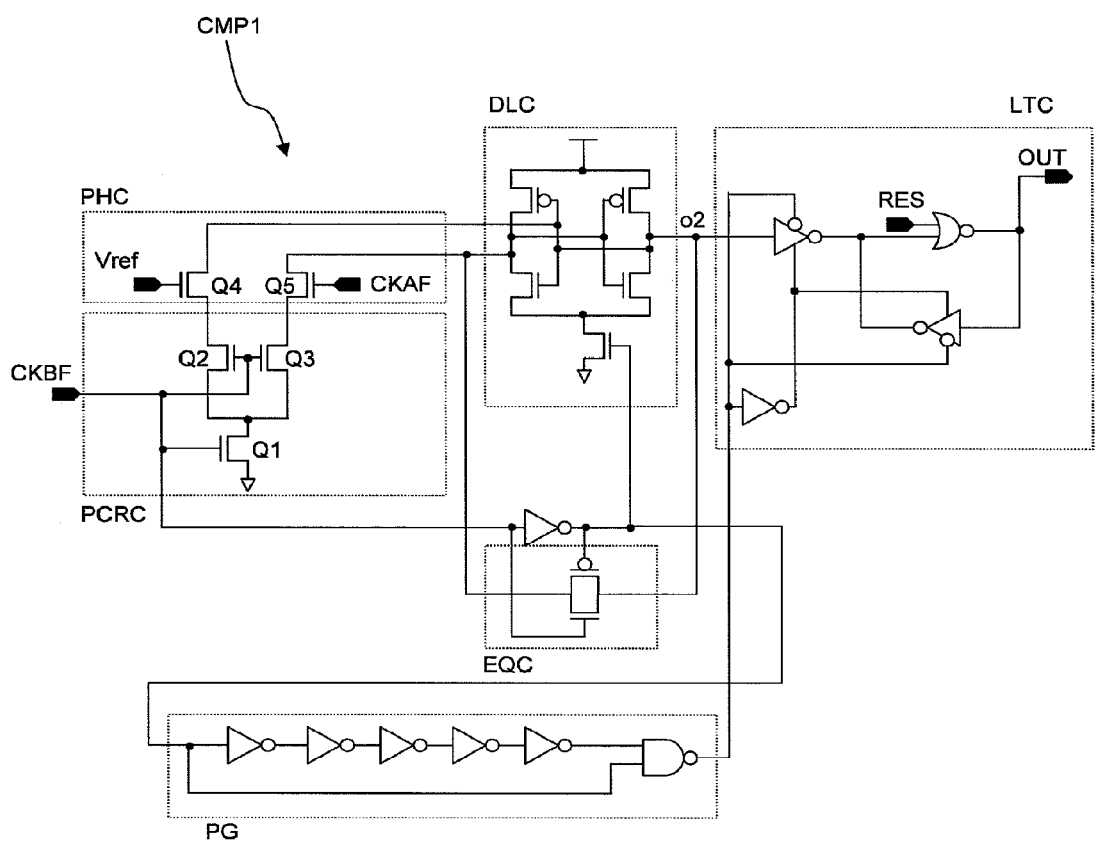
FIG. 9 is a circuit diagram showing a dynamic comparator as an example of a comparison circuit CMP1.

FIG. 9 shows an example of the comparison circuit CMP1. The delay-locked loop circuit DLL needs to compare phases of two clocks having different voltage magnitudes. However, when different voltage magnitudes are used for the power-supply voltage for a region provided with a comparator and a clock to be compared. In such case, logical threshold values differ from each other according to a technique that uses normal logical threshold values for the comparison. The comparison result indicates a large difference in the phases. As another example, CKAF may be converted into the same voltage as CKBF through the level converting circuit. Then, flip-flops may be used to compare phases. In this case, the level converting circuit remarkably increases a delay and degrades the phase alignment accuracy. To solve this problem, the logical threshold value varies with the power-supply voltage. One clock CKBF is assumed to be an activation signal for a differential input stage. The other clock CKAF is assumed to be reference voltage Vref that is approximately equivalent to half the drive voltage VDDA for the clock CKAF. The comparison circuit CMP1 is configured as a dynamic comparator capable of differential amplification. That is, the comparison stage includes an active load circuit PCRC and a differential input circuit PHC. A sense latch DLC latches an output from the comparison stage. The active load circuit PCRC includes n-channel MOS transistors (nMOS transistors) Q1, Q2, and Q3. The differential input circuit PHC includes nMOS transistors Q4 and Q5. The sense latch DLC includes a CMOS static latch. The sense latch DLC is inactivated when the active load circuit PCRC for the comparison stage is activated (high-level period for CKBF). An equalizer circuit EQ equalizes a differential input/output node of the sense latch DLC. The sense latch DLC supplies an operating current to the differential input circuit PHC. This causes a difference between currents flowing through Q4 and Q5 in accordance with a voltage difference between Vref and CKAF. The equalizer circuit EQC stops equalization when the active load circuit PCRC for the comparison stage is inactivated (low-level period for CKBF). In addition, the sense latch DLC is activated to latch the comparison result in accordance with the state (difference between currents flowing through Q4 and Q5) of the differential input circuit PHC during the activation period. An output from the sense latch DLC passes through an output latch circuit LTC and is supplied to the delay-locked loop circuit DLL. The output latch circuit LTC suppresses an input based on the output from a pulse generator PG and outputs the already latched data during the activation period of the active load circuit PCRC for the comparison stage, i.e., during the inactivation period of the sense latch DLC. The output latch circuit LTC latches and outputs an output from the sense latch DLC during the inactivation period of the active load circuit PCRC for the comparison stage, i.e., during the activation period of the sense latch DLC.

The comparison circuit CMP1 in FIG. 9 detects the magnitude relation by comparing the signal CKAF with the reference voltage Vref. The reference voltage Vref uses a value that is generated by resistance division so as to be equivalent to half the voltage applied to the DVFS control region FVA. The comparison circuit CMP1 can easily synchronize with a variation in the logical threshold value corresponding to the voltage change. When there is a very large power-supply voltage difference between two clocks to be compared, the embodiment can ensure higher comparison precision than a conventional technique that uses flip-flops for comparison through the level converting circuit.

Figure 10:
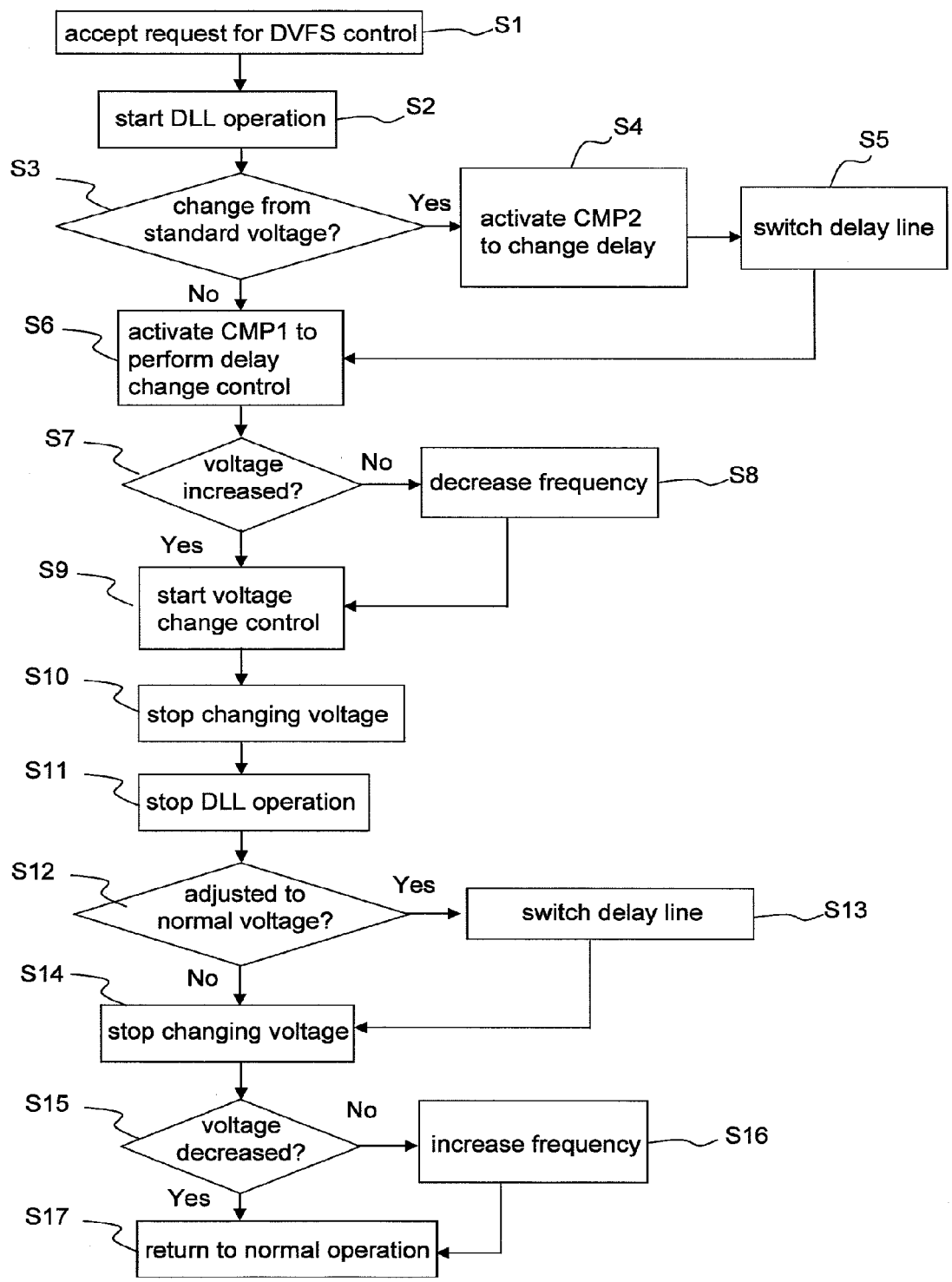
FIG. 10 is a flowchart showing a DVFS control operation on the data processing system according to the invention.

FIG. 10 is a flowchart exemplarily showing a DVFS control operation on the data processing system according to the invention. The power-supply voltage VDDB is set to the standard voltage of 1.2 V, for example. The power-supply voltage VDDA is selectable between the standard voltage (e.g., 1.2 V) and a non-standard voltage (e.g., 0.8 V) lower than that. The system accepts a request for the DVFS control over the circuit FVA to be controlled (S1). The system starts operating the delay-locked loop circuit DLL (S2). The system determines whether the power-supply voltage VDDA for the circuit FVA to be controlled changes from the standard voltage to the non-standard voltage or vice versa (S3). Through the determination may preferably use the voltage information VVAL from the integrated controller SYSC, an on-chip voltage measuring means, when available, may measure and determine an output from the regulator REG. When the standard voltage is changed to the non-standard voltage, control is performed to select the clock line (path CKAb in FIG. 1) having the delay amount corresponding to the lowest voltage subject to the DVFS control. This is because the clock signal is distributed to the clock line (path CKAa in FIG. 1) having no extra delay device in the normal voltage state. For this purpose, the system activates CMP2 as described with reference to FIG. 1 and adjusts the clock delay amount using the comparison result from the CMP2 (S4). The system then changes the path CKAa to the path CKAb (S5). Though not shown in FIG. 10, the path CKAa can be changed to the path CKAb synchronously with a power-on sequence or as a background process during the normal operation. Setting the first delay condition may take a long time. It is effective to set the delay without affecting chip performance. In consideration for this, the normal operating voltage (e.g., 1.2 V) is preferable for an initial operation such as cold start that uses the external regulator REG to power the semiconductor chip CHIP. The reason is as follows. As the normal operating voltage allows distribution of clocks that do not pass through the delay sequence, the circuit can operate without needing to await the lock time of the delay-locked loop circuit DLL. The lock can be performed as a background process during the circuit operation. Once the lock is performed, the clock phase is always ensured under the condition that the delay-locked loop circuit DLL adjusts a delay as well as the voltage.

The system activates the comparison circuit CMP1 to start compensating clock phases under the DVFS control while the voltage varies (S6). Whether the changed voltage value increases (changing the non-standard voltage to the standard voltage) or decreases (changing the standard voltage to the non-standard voltage) is determined (S7). To reduce the voltage, the system performs control to select an operating frequency (changing to a low frequency) at the final voltage (S8). To increase the voltage, no high-frequency operation is possible at a low voltage. The system notifies the regulator REG of a voltage change without setting the frequency to the value corresponding to a target voltage (S9). The regulator REG receives the voltage change instruction and changes the voltage value to the target one (S10). The communication may use existing interfaces such as IIC (Inter-Integrated Circuit communication protocol). When available, a leased line is effective because it permits interrupt control and ensures fast responses. When the voltage value in the semiconductor chip CHIP reaches the target value, the system performs a procedure to terminate the operation of the delay-locked loop circuit DLL (S11). Preferably, voltage information from the regulator REG may be used to confirm that the voltage value reaches the target value. The confirmation may use information from an on-chip voltage measuring means, when available.

After the voltage is stabilized to the final target value, the system determines whether or not the voltage is standard (S12). When the standard voltage is determined, the system provides control to switch the path CKAb having the extra delay line to the path CKAa having no extra delay line (S13). The system determines whether the most recently changed power-supply voltage decreases (changing the standard voltage to the non-standard voltage) or increases (changing the non-standard voltage to the standard voltage) (S15). To increase the voltage, the system sets the frequency to a target value (S16). After completing the series of operations, the system returns to the normal operation (S17).

Figure 11:
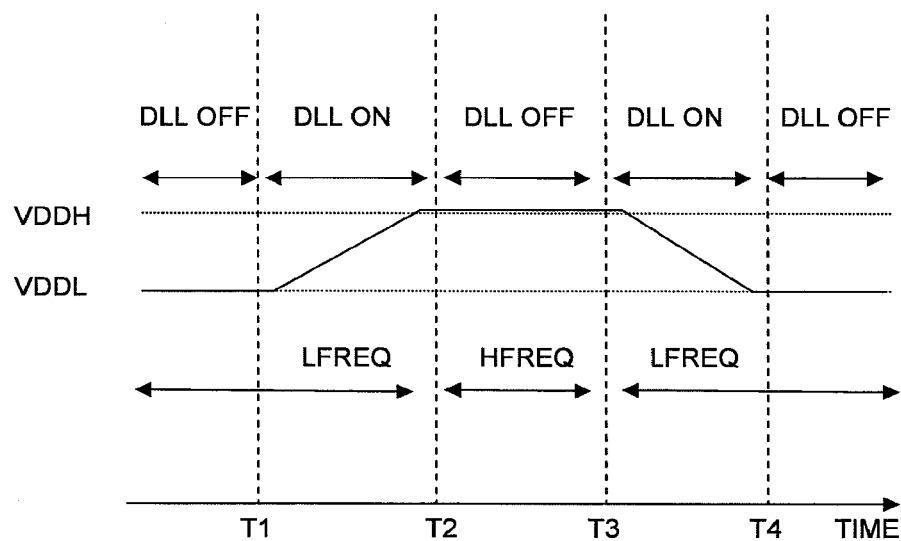
FIG. 11 is a timing chart showing periods of activating and inactivating the delay-locked loop circuit DLL.

FIG. 11 shows periods of activating and inactivating the delay-locked loop circuit DLL. According to the invention, the delay-locked loop circuit DLL is sure to operate when the power-supply voltage is changed. As shown in FIG. 11, the delay-locked loop circuit DLL operates while the voltage increases and reduces. In some cases, the delay-locked loop circuit DLL may need not to be always active. The reason follows. A variation in the delay amount is minimal when the voltage state is fixed. In such case, the delay adjustment may be unnecessary. Depending on usage states of the semiconductor chip CHIP, however, an excess operation of the semiconductor chip CHIP may increase a potential variation in the semiconductor chip CHIP. In such case, operating the delay-locked loop circuit DLL may be effective for adjusting a delay variation due to the potential variation. When such condition is unavailable, appropriately inactivating the delay-locked loop circuit DLL suppresses unnecessary power consumption and contributes to a low-power design.

Figure 12:
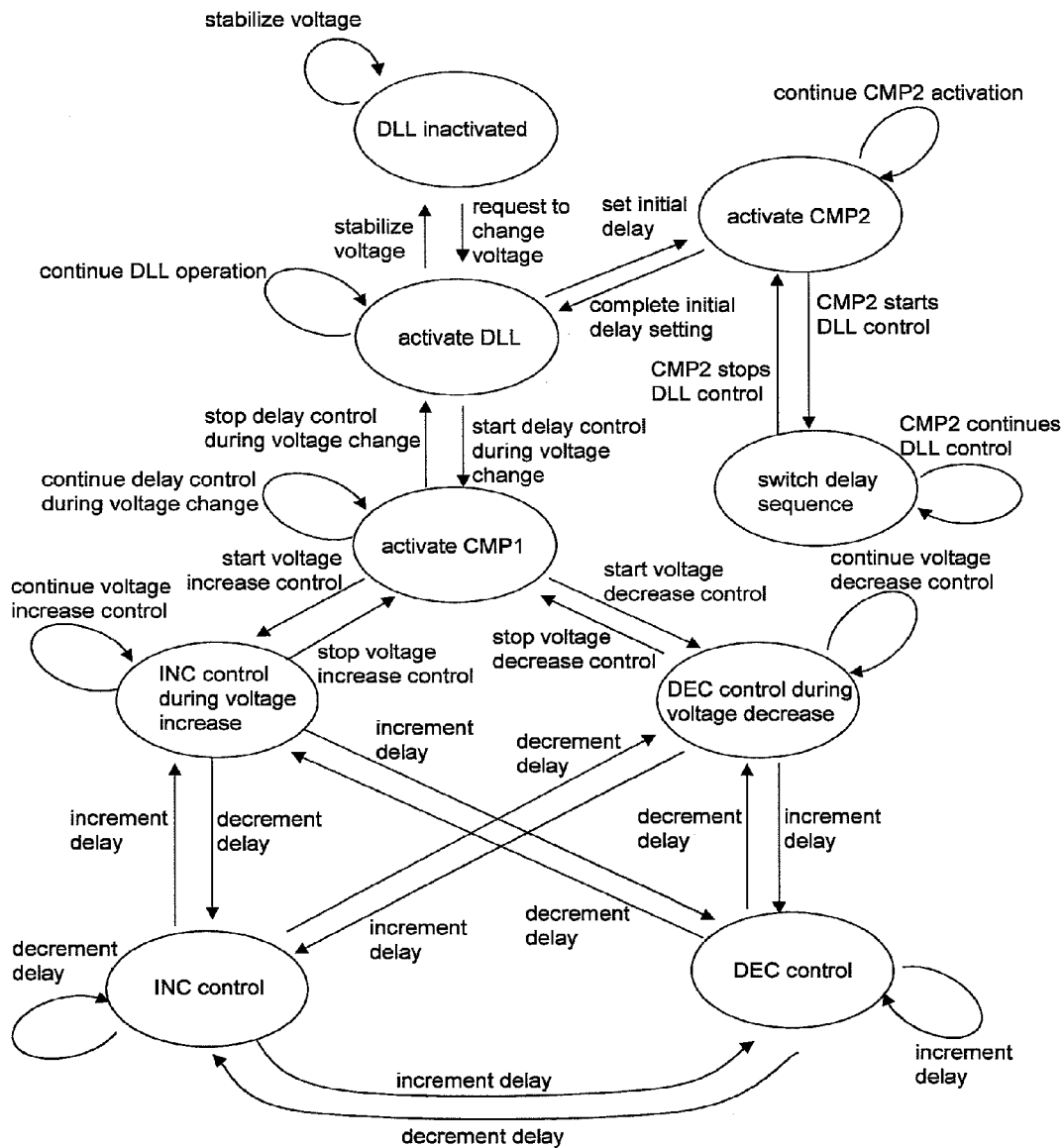
FIG. 12 is a state transition diagram showing operations on the delay-locked loop circuit DLL according to the invention.

FIG. 12 is a state transition diagram showing operations on the delay-locked loop circuit DLL according to the invention.

When the voltage is stable, the delay-locked loop circuit DLL is preferred to be inactive for low power consumption. The voltage change control is expected to be performed when the DVFS control is subsequently determined to be performed depending on system operation conditions. In such case, control is performed to operate the delay-locked loop circuit DLL. According to the invention, the normal operation distributes clocks to the clock distribution network having no extra delay sequence. On the other hand, the DVFS control selects the clock distribution network having an extra delay. At this time, the comparator CMP2 needs to be operated to set an initial delay value. The comparator CMP2 starts to set the delay sequence and perform control for switching the delay sequence. After the delay sequence is switched, the voltage is changed. When the voltage change control is performed according to the invention, the comparator CMP1 starts to provide control for adjusting delay values of the clock distribution network. Further, according to the invention, the delay adjustment method is selected depending on whether the voltage is controlled to increase or reduce. Control to reduce the voltage requires control to reduce delay stages. There is provided control to decrement delay stages (DEC control). Control to increase the voltage requires control to increase delay stages. There is provided control to increment delay stages (INC control). The comparison control of CMP1 still takes effect while the DEC control and the INC control are performed. Further correction may be needed such as greatly changing the delay value. In such case, control is performed to accordingly increment or decrement the delay stages.

Figure 13:
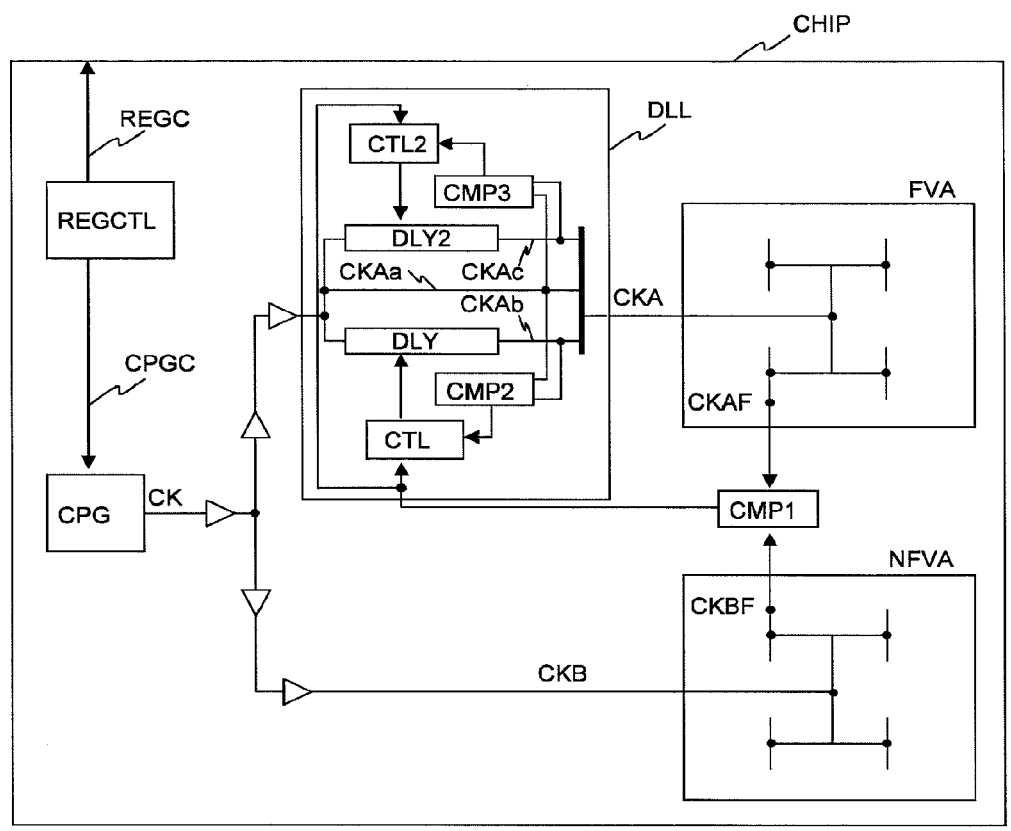
FIG. 13 is a block diagram exemplarily showing a semiconductor chip that provides control to not only decrease but also increase frequencies of clocks distributed to the DVFS control region FVA in accordance with voltage control.

FIG. 13 shows an example of providing control to not only decrease but also increase frequencies of clocks distributed to the DVFS control region FVA in accordance with voltage control. Under the condition of normal voltage, the design without an extra delay is effective in consideration for various uncertainties. When the voltage is reduced, there is provided control similar to that described with reference to FIGS. 1 and 3. When the voltage is increased higher than the standard voltage, the delay line is changed to DLY2 and then the DVFS control is performed. At this time, the comparison circuit CMP3 compares CKAa and CKAc to select the delay line DLY2. This makes it possible to suppress the amount of delay increase when a high voltage is applied to the DVFS control region FVA. The reason follows. As shown in FIG. 2C, the high voltage causes the delay to vary slowly. It is possible to decrease the number of extra delay devices that may be added to the delay sequence. Generally, increasing the number of delay devices allows the system to be easily susceptible to an effect of various uncertainties. Decreasing the effect is particularly effective for the high-voltage condition that requires fast processing.

FIG. 13 shows the example of independently providing the delay devices for the voltage boost process and the voltage drop process. Further, the delay amount for the voltage boost process may be used in conjunction with the delay circuit for the voltage drop process. In this case, the voltage boost process may adjust the clock to the smallest number of delay stages for the delay line DLY. The DVFS voltage boost control may be performed thereafter. Delay devices may be increased as the voltage is boosted.

Figure 14:
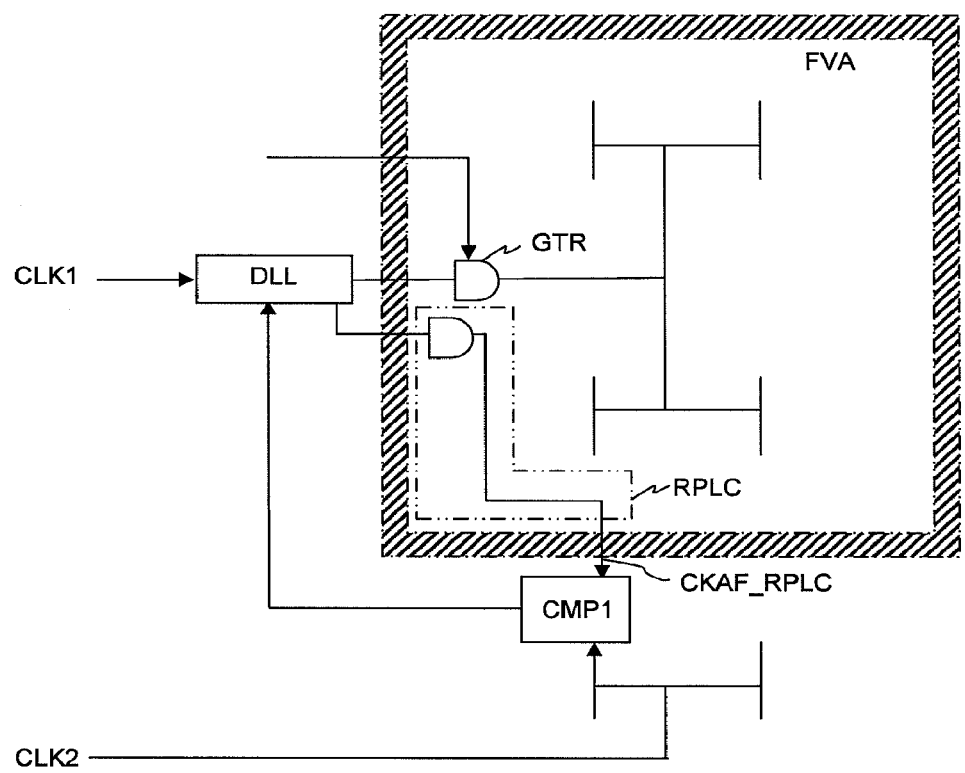
FIG. 14 is an explanatory diagram showing an example of applying the DVFS control according to the invention to an region that uses a clock gating technique.

FIG. 14 shows an example of applying the DVFS control according to the invention to a region that uses a clock gating technique. GTR denotes a clock gate for clock gating and selectively prevents clock supply to the region FVA depending on sleep mode. The invention necessitates clock phase alignment in consideration for a propagation delay in the clock tree. The delay adjustment becomes impossible when the clock gating technique stops clock distribution. To solve this problem, a replica circuit RPLC for clock distribution is provided so as to be able to adjust a clock delay even during clock gating. A replica clock CKAF_RPLC is used to adjust the delay during the clock gating. The clock gating technique becomes available in this manner. Even under the low-power situation, it is possible to perform control over a voltage change while the communication synchronization is ensured. Generally, the time required for the DVFS control is much longer than the sleep period according to the clock gating technique. The region FVA is capable of sleep mode even when the DVFS control is active. This can promote low power consumption.

Figure 15:
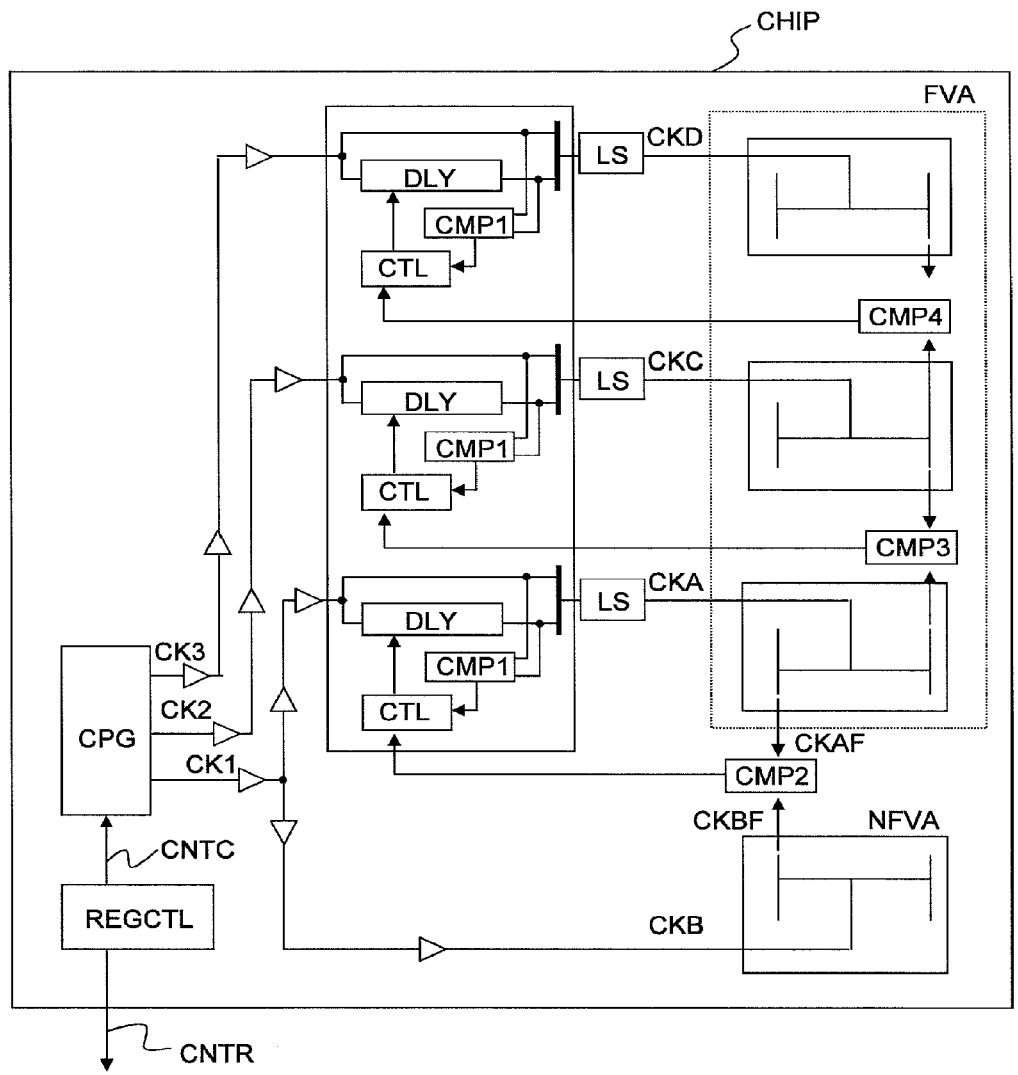
FIG. 15 is a block diagram of a semiconductor chip showing an example of distributing multiple clocks to the DVFS control region FVA.

FIG. 15 shows an example of distributing multiple clocks to the DVFS control region FVA. Generally, characteristic variations of transistors tend to degrade due to reduction of voltage. In particular, sensitivity to variations increases and makes it very difficult to design the clock delay amount. In such case, aligning clock phases is effective. In FIG. 15, the clock CKA for the DVFS control region FVA is aligned to the clock CKB for the non-DVFS control region NFVA. The clock CKA is aligned to the clock CKC. The clock CKC is aligned to the clock CKD. Only digital circuits can be used for the comparison circuits CMP3 and CMP4 since the circuits use the same voltage amplitude for two clocks. The clocks CKA, CKC, and CKD are each provided with a bypass circuit in the normal voltage state. This can avoid the performance degradation when the clocks are distributed in the normal state. The other portions of the configuration are the same as those in FIG. 1 and a detailed description is omitted for simplicity.

Figure 16:
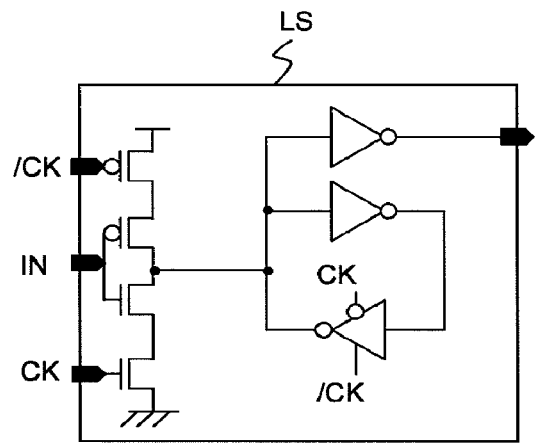
FIG. 16 is a circuit diagram exemplarily showing a level converting circuit LS.

FIG. 16 exemplarily shows a level converting circuit LS. The DVFS control requires signal transmission between blocks that use different signal voltage amplitudes. Special attention should be paid to the signal transmission from a block of small voltage magnitude to a block of large voltage magnitude. Generally, such circuit is provided with a level converting circuit that uses differential signals. There have been problems of increasing restrictions on applying CAD (computer-aided design) to differential signal wiring, increasing an area, and degrading an operation speed. The level converting circuit LS shown in FIG. 16 is simple and uses the amplification effect of a CMOS inverter. The level converting circuit LS includes a clocked inverter and a latch circuit that holds a conversion result signal output from the clocked inverter. The level converting circuit is widely used for level sense latch. Generally, the level converting circuit is used for the synchronization design inside circuit blocks of the same voltage. The level converting circuit is used where the input signal causes a small voltage magnitude. That is, the operating power supply for the level converting circuit LS is greater than a signal amplitude for the input signal IN. Special attention should be paid to shoot-through current when the level converting circuit LS is used under such condition. PMOS cannot be completely cut off because the voltage amplitude for the input signal is smaller than the power supply for the inverter. Because of the clocked inverter configuration, shoot-through current is consumed only during a conversion operation (input operation). In addition, a small circuit can be used to provide the inverter. FIG. 16 shows an example of amplifying input IN synchronously with the activation timing of the MOS transistor under switching control of clocks CK and /CK. The signal amplitude for the clocks CK and /CK uses the same voltage amplitude as the operating power-supply voltage for the level converting circuit LSn. It is possible to turn on the MOS transistor under switching control of clocks CK and /CK for a specified period depending on the number of circuits in FIG. 16 and a working voltage. A clock gating signal may be used for this control. This can ensure high-performance operation while reducing unnecessary power when the circuit is idle.

Figure 17:
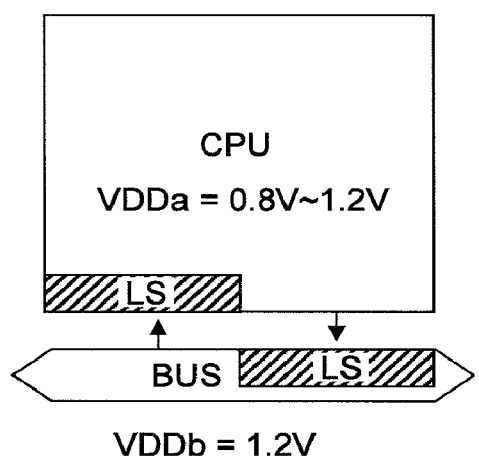
FIG. 17 is an explanatory diagram exemplarily showing installation of the level converting circuit LS in FIG. 16.
Figure 17:
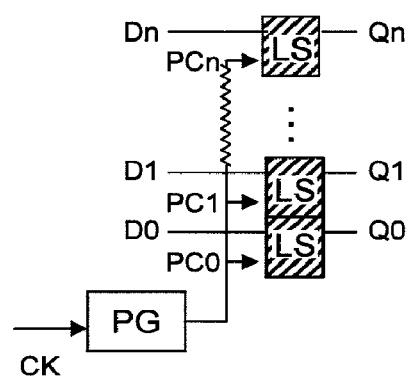

FIG. 17 exemplarily shows installation of the level converting circuit LS in FIG. 16. The level converting circuit LS in FIG. 16 can be also used for the signal voltage from a high voltage amplitude to a low voltage amplitude. This example assumes that an on-chip bus uses a high electric potential and a CPU uses a low electric potential. A receiving-side block controls a receiving-side clock. As shown in FIG. 17, the bus interface is preferably synchronous. The reason follows. Many signal lines are used, and a conventional level converting circuit LS imposes too many restrictions on the degree of layout freedom and increases an area OH. Issues to be considered include: (1) a skew in the pulse generator during pulse clock generation; (2) the number of pulse generators and increase in the power; and (3) a pulse width.

Issue (1) is of no matter because a pulse generator output (PC) can cause static timing analysis (STA). In terms of issue (2), the pulse generator ensures the power approximately 20 times larger than a pulse latch itself. The power does not increase much when the pulse generator is designed to drive 20 latches (F.O.=20). In this case, the power approximates the power for the level converting circuit plus FF. In terms of issue (3), the pulse width is preferred to be as short as possible, for example approximately 100 ps. This can be fully designed because the pulse latch is applied to a limited portion of the pulse interface.

Figure 18:
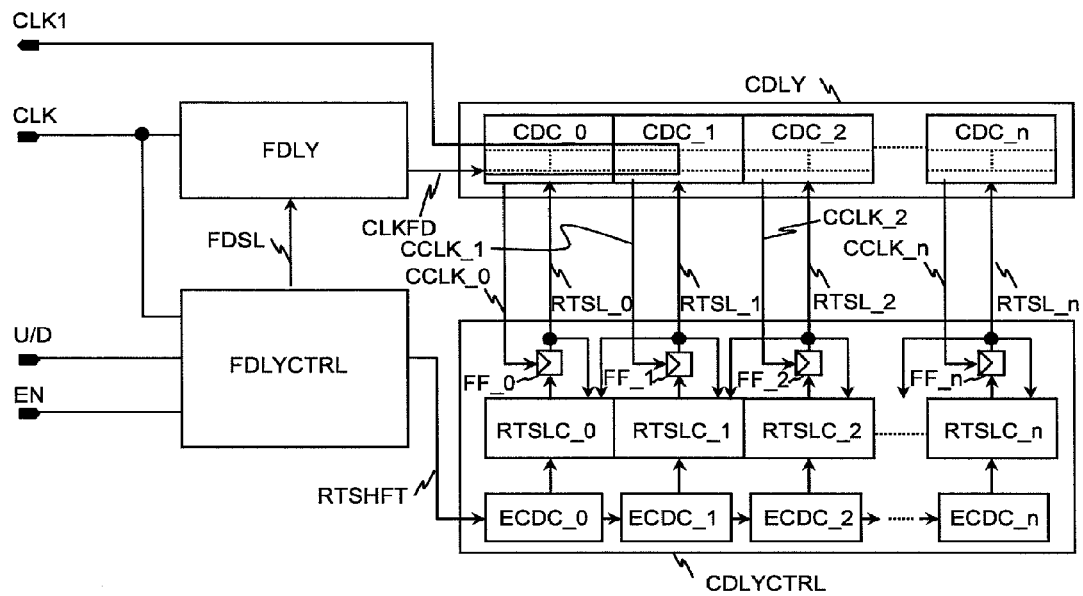
FIG. 18 is a circuit diagram showing another example of a coarse adjustment circuit CDRY for delays.

FIG. 18 shows another example of a coarse adjustment circuit CDRY for delays. As mentioned above, the delay-locked loop circuit DLL according to the invention features a very long delay sequence. The timing design is very difficult for controlling such a long delay using fine adjustment and coarse adjustment in conjunction with each other. Clock phases may be misaligned unexpectedly when the same clock waveform is not used to switch between the fine adjustment and the coarse adjustment. Generally, there is a large phase difference between clock signals flowing through both ends of the coarse adjustment delay circuit CDLY. Some improvements are needed. As shown in FIG. 5, one technique is to decrease a clock phase difference between the coarse adjustment delay circuit and the fine adjustment delay circuit.

As shown in FIG. 18, another effective technique is to transmit delay switch timing of the fine adjustment delay circuit using a pseudo coarse adjustment delay circuit ECDC that has the same delay as the coarse adjustment delay circuit CDLY. In FIG. 18, FDLY denotes a fine adjustment delay circuit. FDLYCTRL denotes a fine adjustment delay control circuit for controlling delay values of the fine adjustment delay circuit. CDLY denotes a coarse adjustment delay circuit. CDLYCTRL denotes a coarse adjustment delay control circuit for controlling delay values of the coarse adjustment delay circuit.

The fine adjustment delay circuit FDLY supplies the clock CLK to be adjusted with the delay amount specified by the fine adjustment delay control circuit and outputs a clock signal CLKFD.

The coarse adjustment delay circuit CDRY supplies the clock signal CLKFD with a coarse adjustment delay and outputs an adjusted clock CLK1. The coarse adjustment delay circuit CDRY includes unit delay circuits CDCs (CDC_0 through CDC_n) coupled in columns. Changing the number of coupled circuits adjusts the delay value. The delay circuit is configured to provide turnarounds. Signals RTSLs (RTSL_0 through RTSL_n) from the coarse adjustment delay control circuit CDLYCTRL specify turnaround points. Signals CCLKs (CCLK_0 through CCLK_n) notify the coarse adjustment delay control circuit CDLYCTRL of clock phases for the coarse adjustment delay circuit CDLY.

The fine adjustment delay control circuit FDLYCTRL finds a delay control amount based on control signals U/P and EN that are generated by the control circuit DLYCTL based on output SCMP from the phase comparator CMP1. The fine adjustment delay control circuit FDLYCTRL and the coarse adjustment delay control circuit CDLYCTRL are notified of the delay control amount. The fine adjustment delay control circuit FDLYCTRL notifies the coarse adjustment delay control circuit CDLYCTRL of an increment or decrement for the coarse adjustment delay value using a signal RTSHFT.

The coarse adjustment delay control circuit CDLYCTRL includes delay circuits ECDCs (ECDC_0 through ECDC_n), control circuits RTSLCs (RTSLC_0 through RTSLC_n), and flip-flops (FF_0 through FF_n). The circuits ECDCs (ECDC_0 through ECDC_n) have delays equivalent to those for the coarse adjustment unit delay circuits CDCs (CDC_0 through CDC_n). The control circuits RTSLCs (RTSLC_0 through RTSLC_n) output signals RTSLs (RTSL_0 through RTSL_n) that specify turnaround points for the coarse adjustment delay circuit and determine coarse adjustment delay values. The flip-flops (FF_0 through FF_n) output signals RTSLs in accordance with clock phases of the CDCs (CDC_0 through CDC_n). The signal RTSHFT is propagated toward later stages such as ECDC_0, ECDC_1, and so on. Consequently, the clock signal CLKFD input to the coarse adjustment delay circuit CDLY synchronizes with the signal RTSHFT input to the fine adjustment delay control circuit CDLYCTRL. Fine adjustment and coarse adjustment delays can be changed for the same clock.

The signal notifying the change of the coarse adjustment delay value is transmitted via the delay device having a delay equivalent to the coarse adjustment delay. This makes it possible to change fine adjustment and coarse adjustment delay values for the same clock and solve the above-mentioned problem of clock phase misalignment.

While there have been described specific preferred embodiments of the present invention, it is to be distinctly understood that the present invention is not limited thereto but may be otherwise variously embodied within the spirit and scope of the invention.

For example, the comparison circuit is not limited to a dynamic comparator but may be configured to include a level shift circuit and a mere differential comparator.

As mentioned above, the invention provides the highly accurate phase comparison circuit having the small circuit scale and effectively provides the DVFS control. The following describes an embodiment for improving the clock comparison accuracy.

Figure 19A:
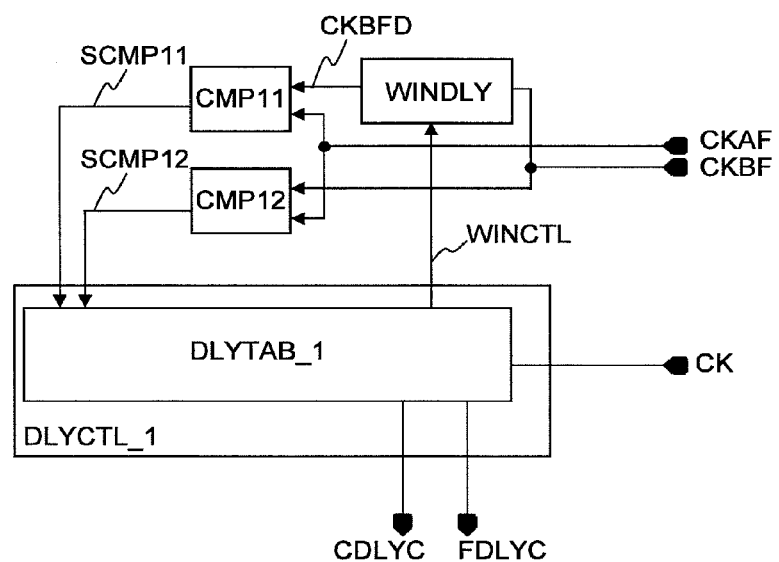
FIGS. 19A, 19B, and 19C provide a block diagram showing another embodiment of the delay-locked loop circuit DLL.
Figures 19B, 19C:
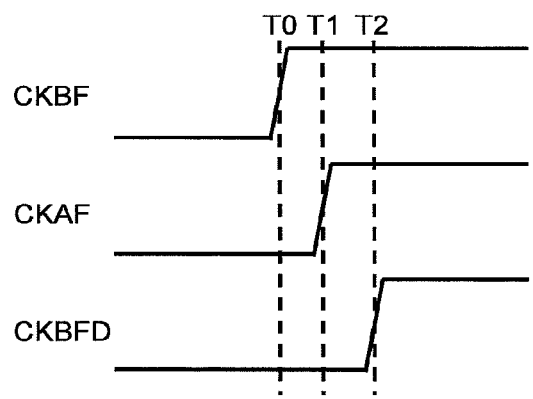

FIGS. 19A, 19B, and 19C show another embodiment of the delay-locked loop circuit DLL. The embodiment compares two clocks by providing a period between a rising edge of one clock and another rising edge of a delay clock that is displaced for a given delay amount. The embodiment adjusts a delay so that a rising edge of the other clock to be compared fits into that period. Accordingly, the embodiment improves the accuracy of phase comparison.

FIG. 19A shows the module configuration and coupling associated with the delay control. FIG. 19B shows phase relation among three clock signals CKAF, CKBF, and CKAFD. An interval between T2 and T0 is hereafter referred to as a phase control window. FIG. 19C shows an example of the delay stage change table (DLYTAB_1). In FIG. 19C, P denotes the current delay variation; Q denotes current WINDLY; and r0 through r5 denote positive integers.

The DLL circuit in FIG. 19A includes a delay series for generating a phase control window WINDLY, two phase comparators CMP11 and CMP12, a delay control circuit DLYCTL_1, a delay stage change table DLYTAB_1, and, though not shown, the coarse adjustment delay circuit and the fine adjustment delay circuit described with reference to FIG. 3. The following describes an example in which only CDLYC and FDLYC can control the coarse adjustment delay circuit (CDLY) and the fine adjustment delay circuit (FDLY). Clocks whose phases need to be compared correspond to clock tree nodes (clocks CKAF and CKBF) that are distributed to two circuit regions (e.g., FVA and NFVA in FIG. 1). Of the two clocks to be compared, the one clock CKAF is directly input to phase comparators CMP11 and CMP12. The other clock CKBF branches. The one passes through phase control window generating delay series WINDLY and is input as a clock CKBFD to the comparator CMP11. The other is directly coupled to the phase comparator CMP12. The phase comparator compares phases of the clocks CKAF and CKBF or those of the clocks CKAF and CKBFD. The phase comparator outputs comparison results SCMP11 and SCMP12 to the delay control circuit DLYCTL_1. The comparison result may indicate a low level when the phase of the clock CKAF is later than the other. The comparison result may indicate a high level when the phase of the clock CKAF is earlier than the other. Instead, output results from the phase comparator may be reversely assumed when the timing relation between phases can be identified. The delay stage change table DLYTAB_1 is provided in the delay control circuit DLYCTL_1. The delay stage change table DLYTAB_1 is supplied with the comparison result signals SCMP11 and SCMP12 and the clock CK having the same phase as the clock distributed to the circuit regions FVA and NFVA. The delay stage change table DLYTAB_1 outputs control signals CDLYC and FDLYC for the coarse adjustment delay and the fine adjustment delay, and a control signal WINCTL for the phase control window generating delay series WINDLY.

The phase control window generating delay series WINDLY generates the phase control window (T2-T0). The phase control window (T2-T0) is designed to be as narrow as ten to several tens of picoseconds so as to be free from transistor performance variability. The two phase comparators CMP11 and CMP12 are used to determine whether or not the clock CKAF fits into the phase control window. As described in FIGS. 2 and 3, the DLL circuit is used to change the power-supply voltage for the FVA region by providing control from the state where phases of the clocks CKAF and CKBF are almost aligned as an initial state, i.e., the phase relation satisfies T0<T1<T2 in FIG. 19B. This initial state makes no change in the number of delay stages for the coarse adjustment delay circuit and the fine adjustment delay circuit. Accordingly, value 0 is assigned to the minimum unit of cycle-based delay control, i.e., delay variation P for fine adjustment delay stages.

The following describes how the voltage is changed from this state. The example shows a case where the voltage for the circuit region FVA begins to drop. In this case, voltage drop control is provided to increase a clock tree delay for the circuit region FVA, causing the CKAF phase to appear late. The initial phase relation T0<T1<T2 changes to T1>T2. At this time, the comparison result SCMP11 changes from the high level to the low level. Receiving this result, the DLL circuit changes the delay variation in the delay stage change table DLYTAB_1 and performs control so that the delay variation is set to P-r1 from the next cycle, where r1 is a positive integer. The delay variation per cycle is subsequently decremented until the clock CKAF fits into the phase control window and the phase relation satisfies T0<T1<T2. This aims to decrease the phase difference between the clocks CKAF and CKBF. In another case, too large a delay variation per cycle may cause too small a delay for the clock CKAF. The phase relation changes to T1<T0<T2. In this case, the comparison results SCMP11 and SCMP12 both change to the high level. Control is performed to change the delay variation in the delay stage change table DLYTAB_1 so that the delay variation is incremented as P+r0 at the next cycle and later, where r0 is a positive integer.

In still another case, a result of changing delays for the coarse adjustment delay circuit and the fine adjustment delay circuit may propagate to the clock tree. Multiple cycles may be needed for a latency (hereafter referred to as a feedback latency) consumed until phases are re-compared in the comparator CMP11 and CMP12. Even though the delay variation P reaches a proper value, it may remain undetected to excessively change the delay variation (overshoot). However, the delay for the phase control window generating delay series WINDLY can be limited to several tens of picoseconds, and the delay variation for the circuit region FVA per clock cycle can be limited to several tens of picoseconds. Therefore, even when the feedback latency is added, a phase difference between the clocks CKAF and CKBF can be limited to approximately 50 psec.

There may be case where the comparison results SCMP11 and SCMP12 indicate the low level and the high level, respectively. In this case, the phase timing relation between the clocks CKBF and CKBFD reverses (T2<T0) due to transistor performance variability or a power supply noise. The width of the phase control window disappears. The phase reversal can be avoided by providing control to increase the width of the phase control window, i.e., to increase the delay amount for the phase control window generating delay series WINDLY from an existing value Q to Q+r5, where r5 is a positive integer.

The width of the phase control window may be too small even though the phase control window is correctly configured. That is, an interval between T0 and T2 may be too large even though the clocks CKBF and CKBFD ensure the correct phase timing relation T0<T2. In this case, the accuracy of the delay-locked loop circuit DLL can be improved by performing control to decrease the phase control window width. Specifically, depending on the SCMP11 and SCMP12 values, the delay amount for the phase control window generating delay series WINDLY is decremented from the existing value Q to Q-r2, Q-r3, or Q-r4, where r2 through r4 are positive integers. On the other hand, a frequent change in the delay amount for the phase control window generating delay series WINDLY may frequently reverse the phase timing relation between the clocks CKBF and CKBFD. In such situation, the delay variation is prevented from being changed, degrading the synchronization accuracy of clock phase alignment. In such case, only when the clock phases maintain the relation CKBF<CKAF<CKBFD, i.e., the phase control window ensures a sufficient width, control is performed to decrement Q and prevent it from being decremented below a given value.

Likewise, when the voltage for the circuit region FVA begins to increase, controlling the phase control window width as mentioned above can synchronize the clock phase with a voltage variation.

As mentioned in the embodiment above, the use of two phase comparators can provide the highly precise clock phase alignment while preventing the area from increasing.

Figure 20:
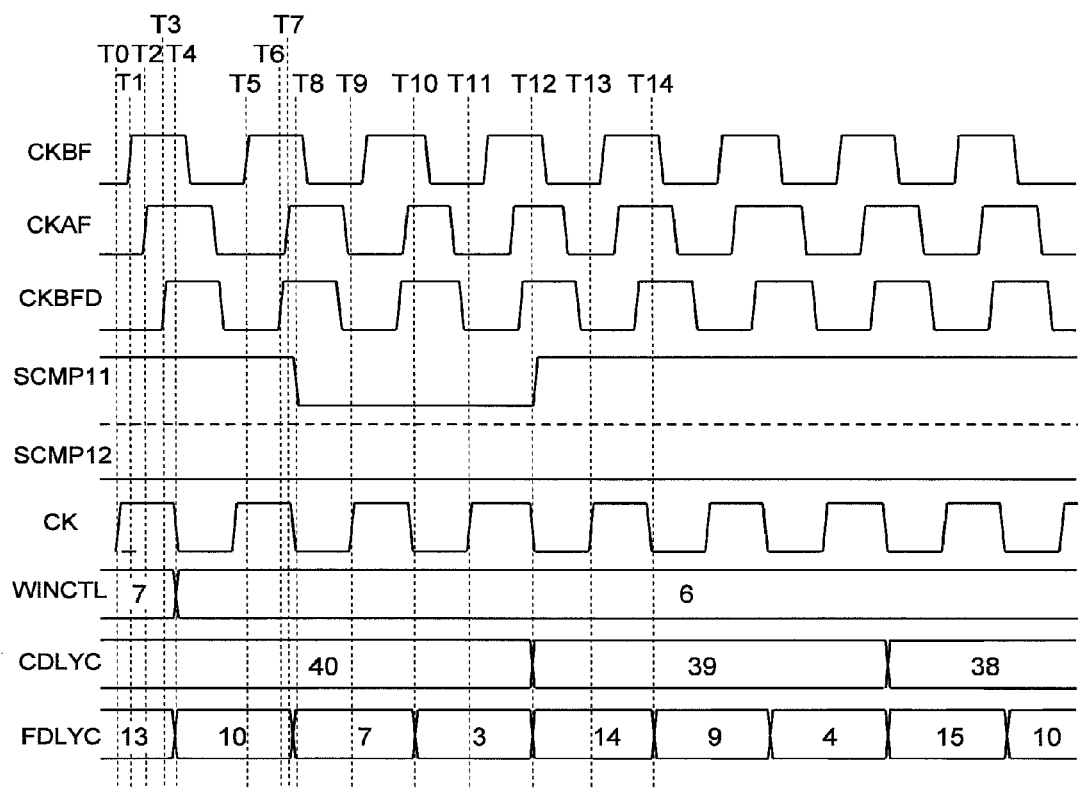
FIG. 20 shows operating waveforms in FIGS. 19A, 19B, and 19C.

FIG. 20 shows operating waveforms in FIGS. 19A, 19B, and 19C. At time T0, the coarse adjustment delay control CDLYC is assumed to be 40. That is, the number of coarse adjustment delay stages is assumed to be 40. The fine adjustment delay control is assumed to be 13. That is, the number of fine adjustment delay stages is assumed to be 13. In the following description, the 16 fine adjustment delay stages are assumed to be equivalent to one coarse adjustment delay stage. The comparison results SCMP11 and SCMP12 first change in accordance with the phase timing relation among the control clocks CKAF, CKBF, and CKBFD. For example, the clock phase relation is CKBF<CKAF<CKBFD at times T1, T2, and T3. The comparison result SCMP11 indicates high level. The comparison result SCMP12 indicates low level. In this case, both clocks belong to the phase control window. On the other hand, the clock phase relation is CKBF<CKBFD<CKAF at times T5, T6, and T7. The clocks do not belong to the phase control window. In this case, the comparison result SCMP11 changes from high to low level at time T8. The control signals WINCTL, CDLYC, and FDLYC respectively correspond to the delay amount, the coarse adjustment delay, and the fine adjustment delay and vary in synchronization with the clock CK. At time T0, for example, the comparison results SCMP11 and SCMP12 indicate the high level and the low level, respectively. At time T4, the phase control window delay amount control WINCTL decreases from 6 to 5. The fine adjustment delay control FDLYC decreases by three stages from 13 to 10. It is assumed that the delay amount control WINCTL is assigned the minimum value of 6 and no change occurs thereafter. At time T9, the comparison result SCMP11 changes to the low level. It should be avoided to further increase the delay stage variation per cycle. The fine adjustment delay is changed from minus three stages to minus four stages. At time T10, in response to this change, the fine adjustment delay control FDLYC decreases by four stages from seven to three. At time T11, the comparison result SCMP11 remains low. The delay stage variation per cycle needs to be further increased. The fine adjustment delay is further changed from minus four stages to minus five stages. Only the fine adjustment circuit cannot generate a delay variation. Accordingly, the delay for the coarse adjustment is changed simultaneously. At time T12, the coarse adjustment delay control is changed from 40 to 39. The fine adjustment delay control FDLYC is changed from 3 to 14. The fine adjustment delay amount decreases by five stages. At time T13, the comparison result SCMP11 again goes high. Since the delay control amount is provided appropriately, the delay stage variation per cycle remains unchanged as minus five. At time T14, the fine adjustment delay control FDLYC decreases by five stages from 14 to 9.

While the embodiment described with reference to FIGS. 19A, 19B, and 19C can improve the accuracy, the following describes an embodiment that further improves the accuracy. Enhancing the scope of operating voltage change increases the latency variation of the buffer for propagating clocks. As a result, the feedback latency increases to degrade the accuracy of comparing phase differences for the clocks CKAF and CKBF. It is necessary to ensure the clock phase synchronization accuracy even when the scope of operating voltage change is enhanced. The embodiment is described below.

Figures 21A, 21B:
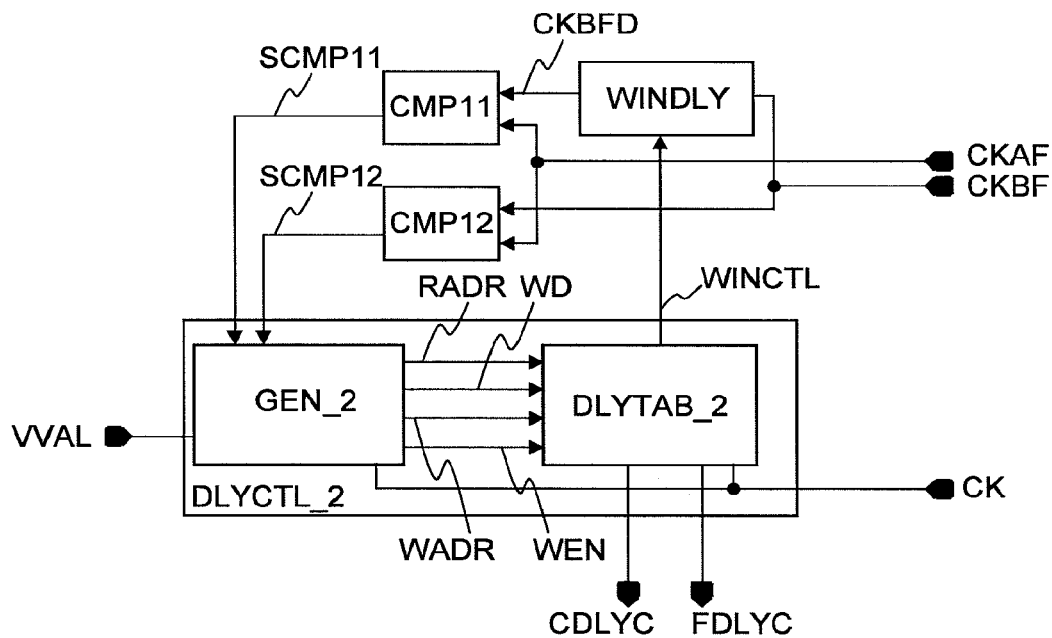
FIGS. 21A and 21B provide a block diagram showing an embodiment that enables more precise delay control by adding a calibration function to the delay control function described with reference to FIGS. 19A, 19B, and 19C.

FIGS. 21A and 21B show the embodiment that enables more precise delay control by adding a calibration function to the delay control function described with reference to FIGS. 19A, 19B, and 19C. FIG. 21A shows the module configuration and coupling associated with the delay control. FIG. 21B shows an example configuration of a delay stage change table DLYTAB_2. The module in FIG. 21A includes the phase control window generating delay series WINDLY, two phase comparators CMP11 and CMP12, and a delay control circuit DLYCTL_2. The delay control circuit DLYCTL_2 includes the delay stage change table DLYTAB_2 and an address generator GEN_2. The clocks CKAF and CKBF are input and correspond to clock tree nodes for the two circuit regions such as FVA and NFVA in FIG. 1. The clock CKAF is directly coupled to the phase comparator CMP11. Along one route, the CKBF passes through the phase control window generating delay series WINDLY and is coupled as the clock CKBFD to the comparator CMP11. Along the other route, the clock CKBF is directly coupled to the phase comparator CMP12. The phase comparators output clock phase comparison results SCMP11 and SCMP12 to the address generator GEN_2 in the delay control circuit DLYCTL. Similarly to FIGS. 19A, 19B, and 19C, the phase comparison results may reversely notify the low level and the high level when the timing relation between phases can be identified. The address generator GEN_2 is supplied with voltage information VVAL and the clock CK having the same phase as the clock distributed to the circuit regions FVA and NFVA. The address generator GEN_2 outputs read address RADR, write data WD, write address WADR, and write enable WEN to the delay stage change table DLYTAB_2. The delay stage change table DLYTAB outputs a delay control signal WINCTL to the phase control window generating delay series WINDLY. The delay stage change table DLYTAB outputs delay amount control signals CDLYC and FDLYC to the coarse adjustment delay and the fine adjustment delay. When the voltage is not changed, the voltage information VVAL is notified of state NOCHANGE. When the voltage is changed, the voltage information VVAL is notified of voltages before and after the change and the voltage change velocity. For example, state 1.2 to 1.0 s1 is notified when the voltage changes from 1.2 V to 1.0 V at velocity 1 (e.g., 50 mV/μsec). The delay-locked loop circuit DLL detects the transition between the state NOCHANGE and the other state to be notified of the beginning or end of voltage change, the start voltage, the end voltage, and the voltage change velocity.

The delay stage change table DLYTAB_2 in FIG. 21B will then be described.

ADDRESS records power-supply voltage states. CDLYC indicates the number of stages for the coarse adjustment delay circuit. FDLYC indicates the number of stages for the fine adjustment delay circuit. WINCTL indicates the window width. LOCK? indicates the phase information. According to this table, the state (ADDRESS, CDLC, FDLYC, WINCTL, LOCK?)=(0x0000, 40, 13, 6, YES) signifies the following. The power-supply voltage is set to the standard one (e.g., 1.2 V). There are 40 coarse adjustment delay stages. There are 13 fine adjustment delay stages. The phase control window has a width of 6. The phase control window contains the clocks CKAF and CKBF as phase information.

The table contains the delay information at a give voltage value. Increasing the table rows improves the accuracy. The table size may be determined in accordance with a trade-off among the target accuracy, the calibration time, and the area.

The operation according to the embodiment is completely the same as that described with reference to FIGS. 19A, 19B, and 19C from the input of the clocks CKAF and CKBF to the output of the comparison results SCMP11 and SCMP12. The difference is that the delay stage change table DLYTAB_2 maintains the change history of the coarse adjustment delay circuit and the fine adjustment delay circuit. While this information is updated, the delay control is provided to improve the clock phase comparison accuracy. As to initial values of the delay stage change table DLYTAB_2, circuit simulation or the like may be used to acquire and maintain delay stage information about the coarse adjustment delay circuit and the fine adjustment delay circuit when the power-supply voltage for the circuit area FVA is changed at a very small velocity (αmV/usec). This velocity is hereafter referred to as a voltage change reference velocity.

As will be described later, calibration updates the initial values preset in the delay stage change table DLYTAB_2 to further improve the phase comparison accuracy. The calibration changes the power-supply voltage to update the initial values of the delay stage change table DLYTAB_2.

The following describes operations during the first calibration. When the delay-locked loop circuit DLL receives a trigger to start changing the voltage from the voltage information VVAL or detects the transition from the state NOCHANGE to the state 1.2 to 1.0 s1, for example, the address generator GEN_2 generates an appropriate read address RADR in accordance with the current voltage and voltage change velocity, and outputs the coarse adjustment delay control signal CDLYC, the fine adjustment delay circuit control signal FDLYC, and the delay control signal WINCTL maintained in the delay stage change table DLYTAB_2. For example, the given address corresponding to the current voltage is assumed to be an initial value. The given voltage change velocity is assumed to be αmV/usec, i.e., double the voltage change reference velocity. Then, the address is incremented or decremented by two addresses so that the voltage change velocity for the circuit simulation equals the actual voltage change velocity. At the same time, the address generator GEN_2 uses the comparison results SCMP11 and SCMP12 to determine whether or not the clock CKAF fits in the phase control window. When the clock CKAF fits in the phase control window, the address generator GEN_2 writes Yes as the write data WD to the skew information LOCK? in the delay stage change table DLYTAB_2. Otherwise, the address generator GEN_2 writes Plus (excess delay amount) or Minus (insufficient delay amount) as the write data WD similarly. At this time, the address generator GEN_2 places the write address WADR subsequent to the read address RADR for the number of latency cycles in consideration for a delay from the delay series change to the phase comparison. In this manner, the number of stages for the coarse adjustment delay circuit and the fine adjustment delay circuit maintained in the current table can be used to record whether or not the skew is smaller than or equal to a specified value.

The following describes operations during the second calibration. The calibration again controls the coarse adjustment delay and the fine adjustment delay under completely the same voltage change condition as the first calibration. For example, the voltage information VVAL changes from the state NOCHANGE to the state 1.2 to 1.0 s1 similarly to the first calibration. The calibration appropriately corrects the delay amount using the value maintained in the skew information LOCK? that is acquired during the first calibration. When the read skew information LOCK? indicates Yes, for example, the calibration outputs a control signal that notifies the same number of coarse adjustment delay stages and the same number of fine adjustment delay stages as the first calibration. When the read skew information LOCK? indicates Plus (excess delay amount), the calibration outputs a control signal that notifies a delay amount equivalent to the maintained delay amount minus a specified amount. When the read skew information LOCK? indicates Minus (insufficient delay amount), the calibration outputs a control signal that notifies a delay amount equivalent to the maintained delay amount plus a specified amount. The corrected delay amount is used to re-acquire the skew information LOCK? about the voltage being changed. The second calibration is expected to decrease a phase difference between the clocks CKAF and CKBF or more frequently record Yes in the skew information LOCK?. The skew between the clocks CKAF and CKBF decreases when the second calibration terminates. Repeating the second calibration minimizes the skew.

The above-mentioned technique stores how the voltage change varies a phase difference between clocks to be compared. The technique uses the calibration operation that corrects the delay variation based on the history. There is provided an effect of being able to improve the comparison accuracy. Further, the delay variation is stored in the table and is appropriately changed and controlled. There is provided another effect of being able to ensure the high comparison accuracy despite a change in the voltage change range or the voltage change velocity, or transition from any voltage state.

Figure 22:
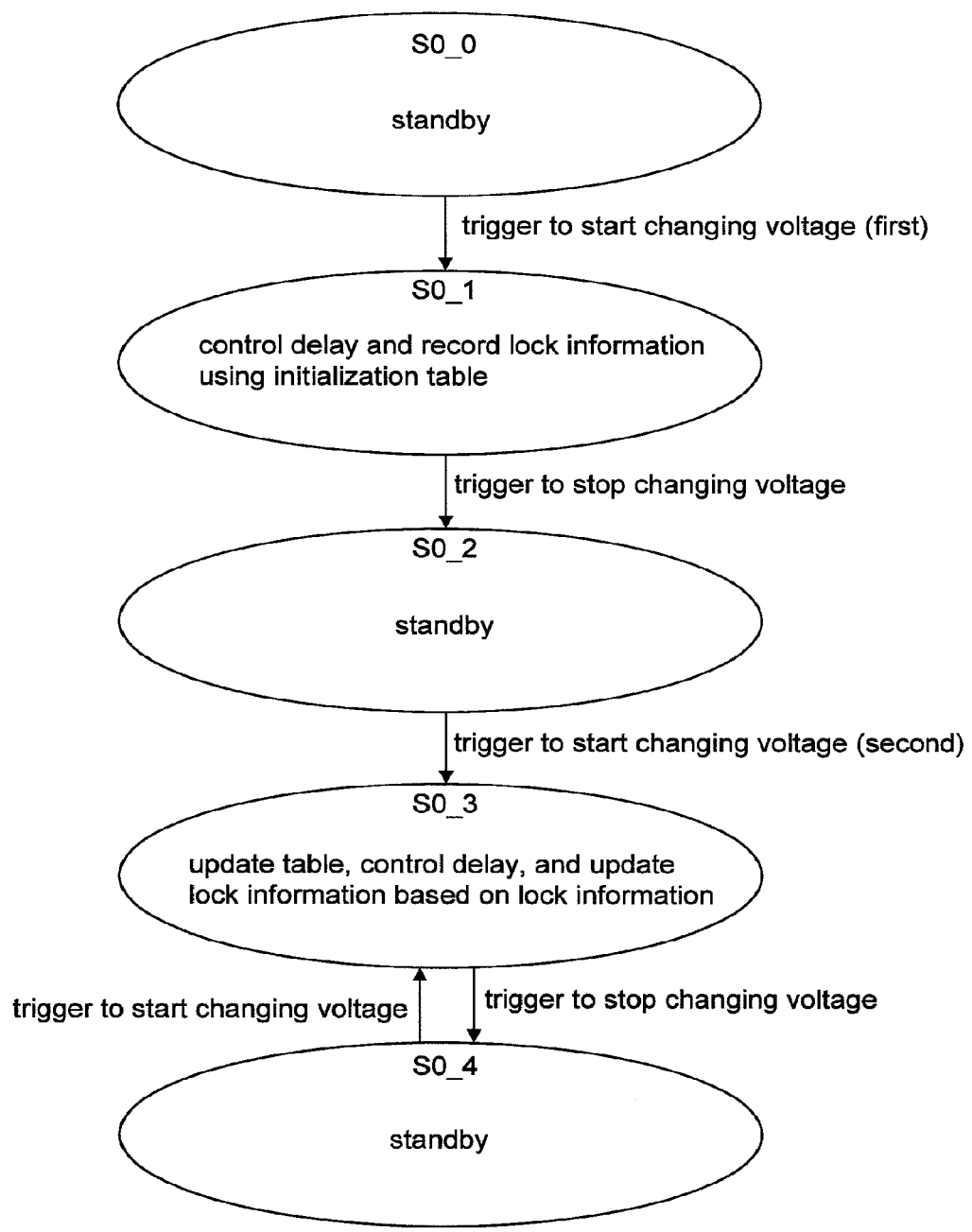
FIG. 22 is a state transition diagram concerning the embodiment described with reference to FIGS. 21A and 21B.

FIG. 22 shows a state transition diagram concerning the embodiment described with reference to FIGS. 21A and 21B. At initial state S0_0, the delay-locked loop circuit DLL goes standby. The delay-locked loop circuit DLL receives a trigger to start changing the voltage from the voltage information VVAL and changes to state S0_1. The delay-locked loop circuit DLL receives a trigger to stop changing the voltage from the voltage information VVAL and changes to state S0_2 to terminate the first calibration. The delay-locked loop circuit DLL re-receives a trigger to start changing the voltage from the voltage information VVAL and changes to state S0_3. The delay-locked loop circuit DLL subsequently receives a trigger to start or stop changing the voltage and alternately changes to state S0_4 and state S0_3.

Figure 23:
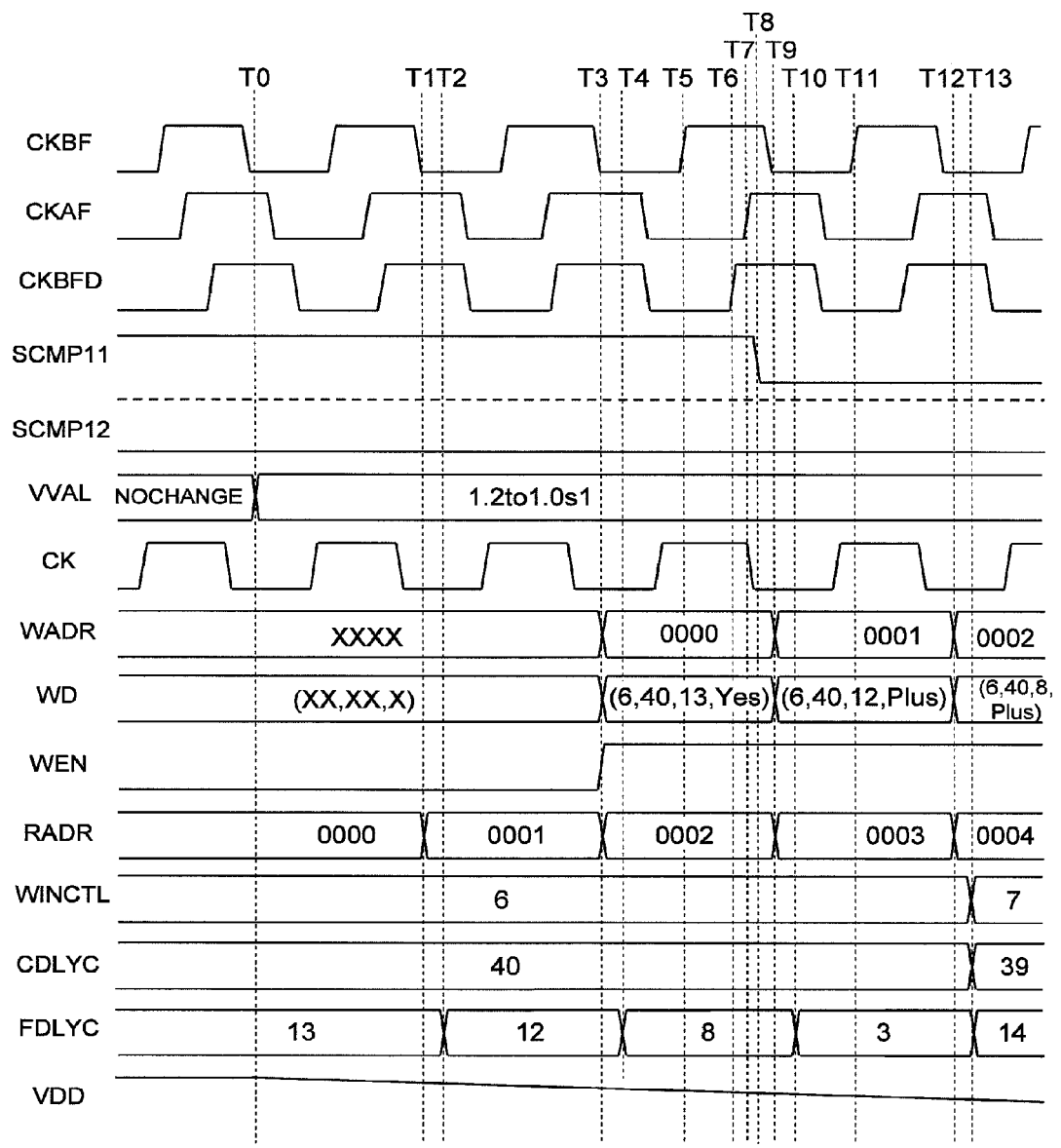
FIG. 23 is an operating waveform diagram according to the first calibration for the embodiment with reference to FIGS. 21A and 21B.

FIG. 23 shows an operating waveform diagram according to the first calibration for the embodiment with reference to FIGS. 21A and 21B. The example shows that a change from voltage 1.2 V to 1.0 V is controlled at velocity 1 in accordance with the delay stage change table DLYTAB_2 as shown in FIG. 21B. At time T0, the voltage information VVAL indicates that the state of keeping the power-supply voltage unchanged (NOCHANGE) changes to the state of changing the voltage (1.2 to 1.0 s1) under the above-mentioned condition. According to this information, the delay control circuit DLYCTL_2 is notified that the voltage starts being changed from 1.2 V to 1.0 V at voltage change velocity 1. At the same time, the power-supply voltage VDD starts decreasing from 1.2 V to 1.0V. Synchronized with a rising edge of the clock CK, the read address changes from 0000 to 0001, 0002, 0003, and then to 0004 corresponding to the voltage changes at times T1, T3, T9, and T12. Receiving the read address, the delay stage change table DLYTAB_2 changes the delay control WINCTL, the coarse adjustment delay control CDLYC, and the fine adjustment delay control FDLYC at times T2, T4, T10, and T13 from (WINCTL, CDLYC, FDLYC)=(6, 40, 13) to (6, 40, 12), (6, 40, 8), (6, 40, 3), and then to (7, 39, 14). The phase comparators CMP11 and CMP12 compare phases of the clocks CKAF, CKBF, and CKBFD and return a comparison result. At times T5, T6, and T7, the phase timing relation among the clocks changes to CKBF<CKBFD<CKAF. At time T8, the comparison result SCMP11 changes from high to low level. Based on the result, the skew information is recorded. At times T3, T9, and T12, the write address WADR changes from 0000 to 0001, and then to 0002. The write data WD changes from (WINCTL, CDLYC, FDLYC, skew information)=(6, 40, 13, Yes) to (6, 40, 12, Plus), and then to (6, 40, 8, Plus). At time T3, the write enable WEN changes from low to high level to enable writing to the delay stage change table DLYTAB_2. This example assumes two clocks for the latency from the clock CK to the clocks CKAF and CKBF.

Figure 24:
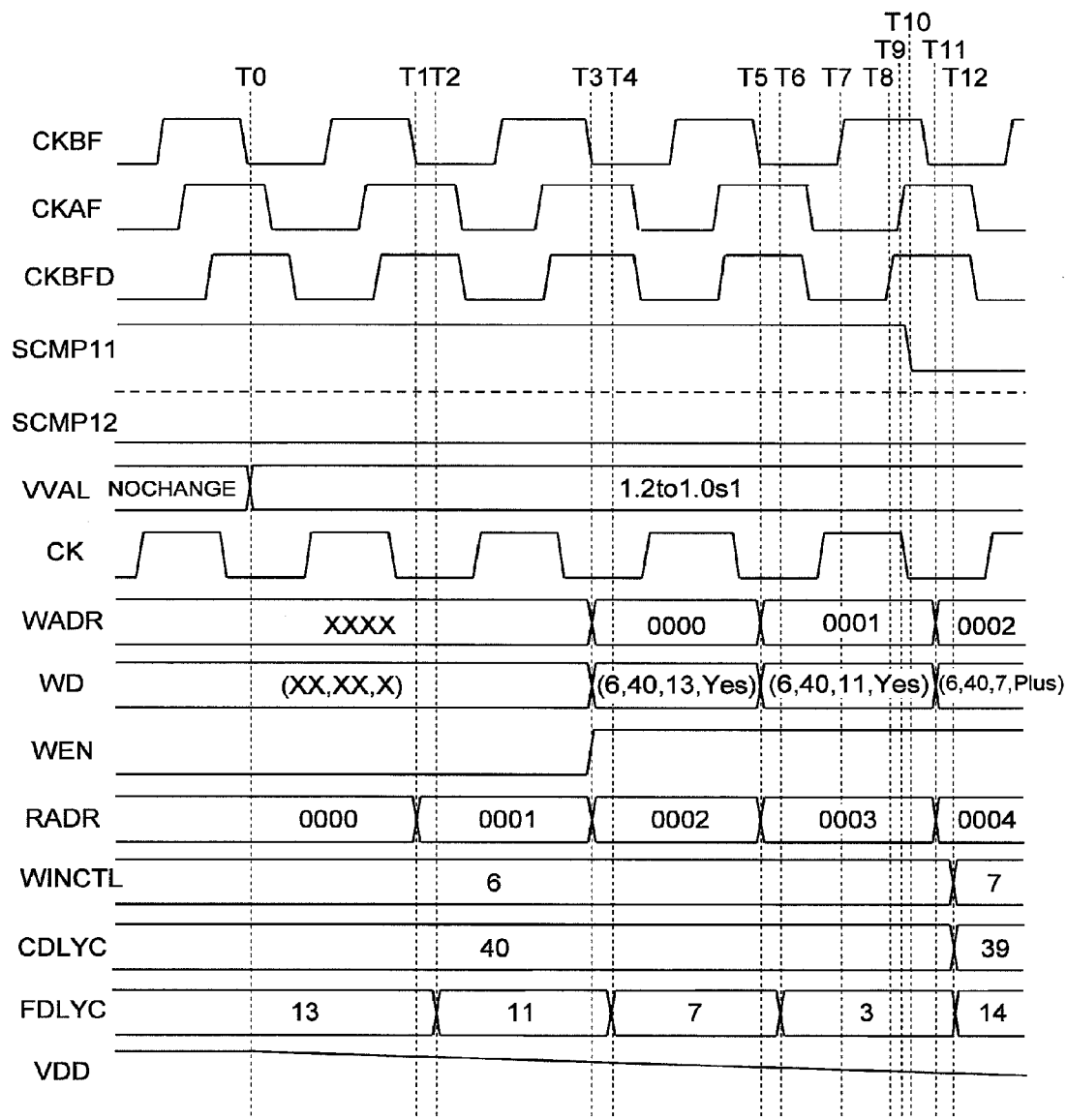
FIG. 24 is an operating waveform diagram according to the second calibration for the embodiment with reference to FIGS. 21A and 21B.

FIG. 24 shows an operating waveform diagram according to the second calibration for the embodiment with reference to FIGS. 21A and 21B. At T0, the voltage information VVAL changes from NOCHANGE to 1.2 to 1.0 s1. According to this information, the delay control circuit DLYCTL_2 is notified that the voltage starts being changed from 1.2 V to 1.0 V at voltage change velocity 1. At the same time, the power-supply voltage VDD starts decreasing from 1.2 V to 1.0 V. Synchronized with a rising edge of the clock CK, the read address changes from 0000 to 0001, 0002, 0003, and then to 0004 corresponding to the voltage changes at times T1, T3, T5, and T11. Receiving the read address, the delay stage change table DLYTAB_2 outputs the delay control WINCTL, the coarse adjustment delay control CDLYC, and the fine adjustment delay control FDLYC at times T2, T4, T6, and T12. The delay stage change table DLYTAB_2 uses the skew information acquired during the first calibration and updates the delay amount information corresponding to the addresses 0001 and 0002 so as to change from (WINCTL, CDLYC, FDLYC)=(6, 40, 13) to (6, 40, 11), (6, 40, 7), (6, 40, 3), and then to (7, 39, 14). The phase comparators CMP11 and CMP12 compare phases of the clocks CKAF, CKBF, and CKBFD and return a comparison result. At times T7, T8, and T9, the phase timing relation among the clocks changes to CKBF<CKBFD<CKAF. At time T10, the comparison result SCMP11 changes from high to low level. Based on the result, the skew information is recorded. At times T3, T5, and T11, the write address WADR changes from 0000 to 0001, and then to 0002. The write data WD changes from (WINCTL, CDLYC, FDLYC, skew information)=(6, 40, 13, Yes) to (40, 11, Yes), and then to (40, 7, Plus). At time T3, the write enable WEN changes from low to high level to enable writing to the delay stage change table DLYTAB_2.

Figure 25:
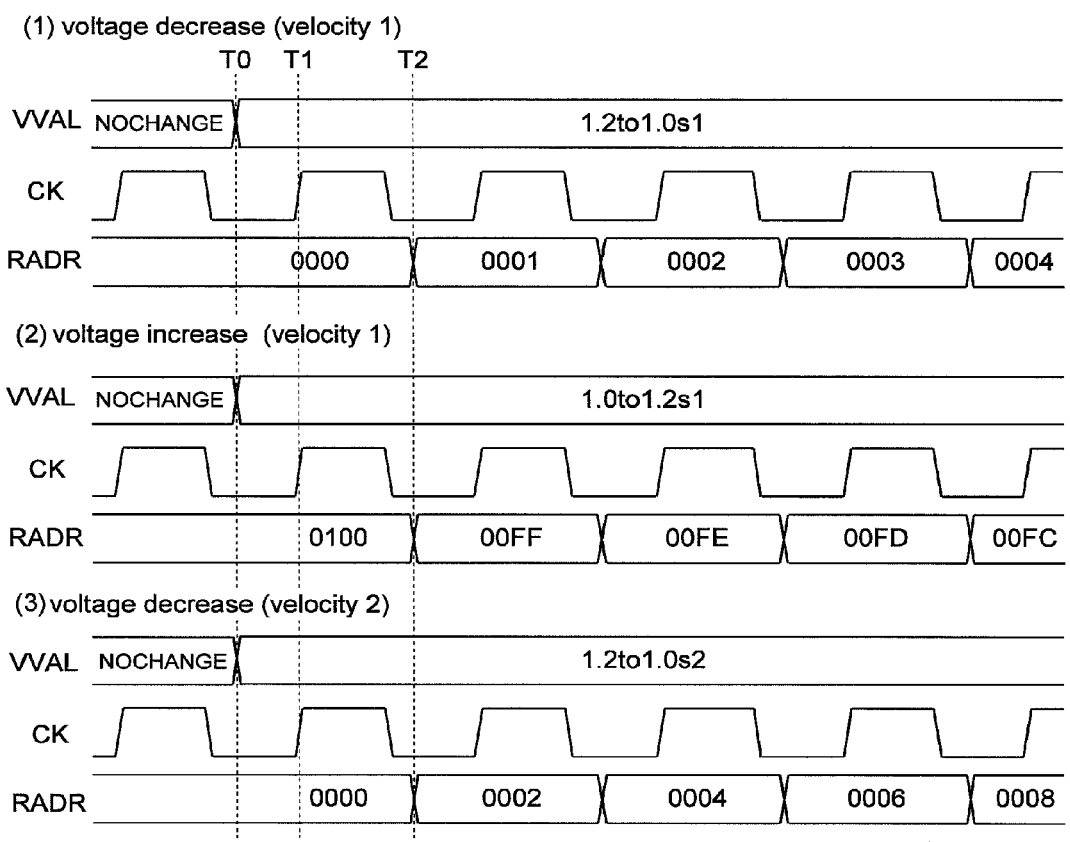
FIG. 25 is an operating waveform diagram showing example operations based on voltage change information different from the embodiment described with reference to FIGS. 21A and 21B.

FIG. 25 shows example operations based on voltage change information different from the embodiment described with reference to FIGS. 21A and 21B. According to case (1) of voltage decrease (velocity 1) in FIG. 25, the voltage information VVAL notifies that the voltage starts changing from 1.2 V to 1.0 V at velocity 1. Based on this information, the delay control circuit DLYCTL_2 increments the start address corresponding to the start voltage and increments addresses in accordance with the change velocity. At time T0, the voltage information VVAL changes from NOCHANGE to 1.2 to 1.0 s1. Then, at time T1, the clock CK rises from low to high level. At T2 and later, the read address RADR synchronously changes from 0000 to 0001, 0002, 0003, and then to 0004. According to case (2) of voltage increase (velocity 1) in FIG. 25, the voltage information VVAL notifies that the voltage starts changing from 1.0 V to 1.2 V at velocity 1. Based on this information, the delay control circuit DLYCTL_2 decrements the start address corresponding to the start voltage and decrements addresses in accordance with the change velocity. At time T0, the voltage information VVAL changes from NOCHANGE to 1.0 to 1.2 S1. Then, at time T1, the clock CK rises from low to high level. At T2 and later, the read address RADR synchronously changes from 0100 to 00FF, 00FE, 00FD, and then to 00FC. Finally, according to case (3) of voltage decrease (velocity 2) in FIG. 25, the voltage information VVAL notifies that the voltage starts changing from 1.2 V to 1.0 V at velocity 2. Based on this information, the delay control circuit DLYCTL_2 increments the start address corresponding to the start voltage and increments addresses in accordance with the change velocity. At time T0, the voltage information VVAL changes from NOCHANGE to 1.2 to 1.0 s2. Then, at time T1, the clock CK rises from low to high level. At T2 and later, the read address RADR synchronously changes from 0000, to 0002, 0004, 0006, and then to 0008. According to the example, velocity 2 is assumed to be double velocity 1. Incrementing the address by two addresses compensates for a difference between the velocities.

Figures 26A, 26B:
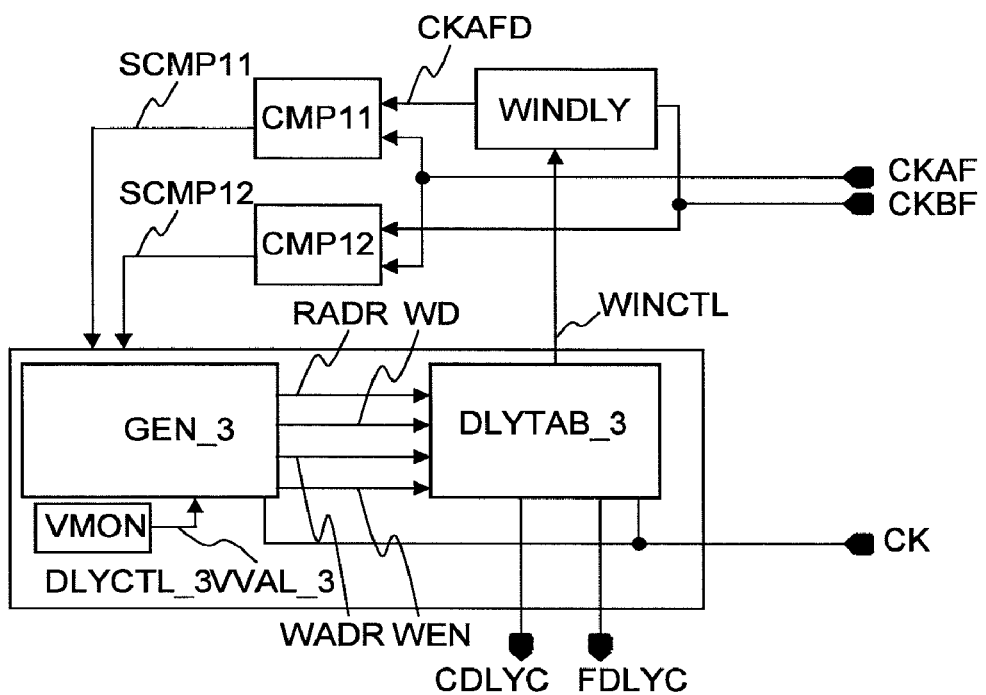
FIGS. 26A and 26B provide a block diagram showing another embodiment of enabling highly precise delay control without using voltage information VVAL from outside by adding a voltage sensor to the delay control function described with reference to FIGS. 21A and 21B.

FIGS. 26A and 26B show another embodiment of enabling highly precise delay control without using voltage information VVAL from outside by adding a voltage sensor to the delay control function described with reference to FIGS. 21A and 21B. FIG. 26A shows the module configuration and coupling associated with the delay control. FIG. 26B shows operations of a delay stage change table DLYTAB_3. FIG. 26A includes the window generating delay series WINDLY, the two phase comparators CMP11 and CMP12, a delay control circuit DLYCTL_3, and a voltage sensor VMON. The delay control circuit DLYCTL_3 includes the delay stage change table DLYTAB_3 and an address generator GEN_3. The clocks CKAF and CKBF are input and correspond to clock tree nodes for the two circuit regions such as FVA and NFVA in FIG. 1. The clock CKAF is directly coupled to the phase comparator CMP11. Along one route, the CKBF passes through the phase control window generating delay series WINDLY and is coupled as the clock CKBFD to the comparator CMP11. Along the other route, the clock CKBF is directly coupled to the phase comparator CMP12. The phase comparators output clock phase comparison results SCMP11 and SCMP12 to the address generator GEN_3 in the delay control circuit DLYCTL. Similarly to FIGS. 19A, 19B, and 19C, the phase comparison results may reversely notify the low level and the high level when the timing relation between phases can be identified. The address generator GEN_3 is supplied with voltage information VVAL_3 from the voltage sensor VMON and the clock CK having the same phase as the clock distributed to the circuit regions FVA and NFVA. The address generator GEN_3 outputs read address RADR, write data WD, write address WADR, and write enable WEN to the delay stage change table DLYTAB_3. The delay stage change table DLYTAB outputs a delay control signal WINCTL to the phase control window generating delay series WINDLY. The delay stage change table DLYTAB outputs delay amount control signals CDLYC and FDLYC to the coarse adjustment delay and the fine adjustment delay. The embodiment differs from the others in that the voltage information VVAL is acquired from the internally provided voltage sensor VMON, not from the external regulator. The other operations are completely the same as the other embodiments. For example, as mentioned above, the delay stage change table DLYTAB_3 maintains the change history such as the coarse adjustment delay and the fine adjustment delay. The calibration then updates the history. The internal voltage sensor can provide highly accurate delay amount control without receiving the voltage information VVAL from the external voltage regulator.

Figure 27:
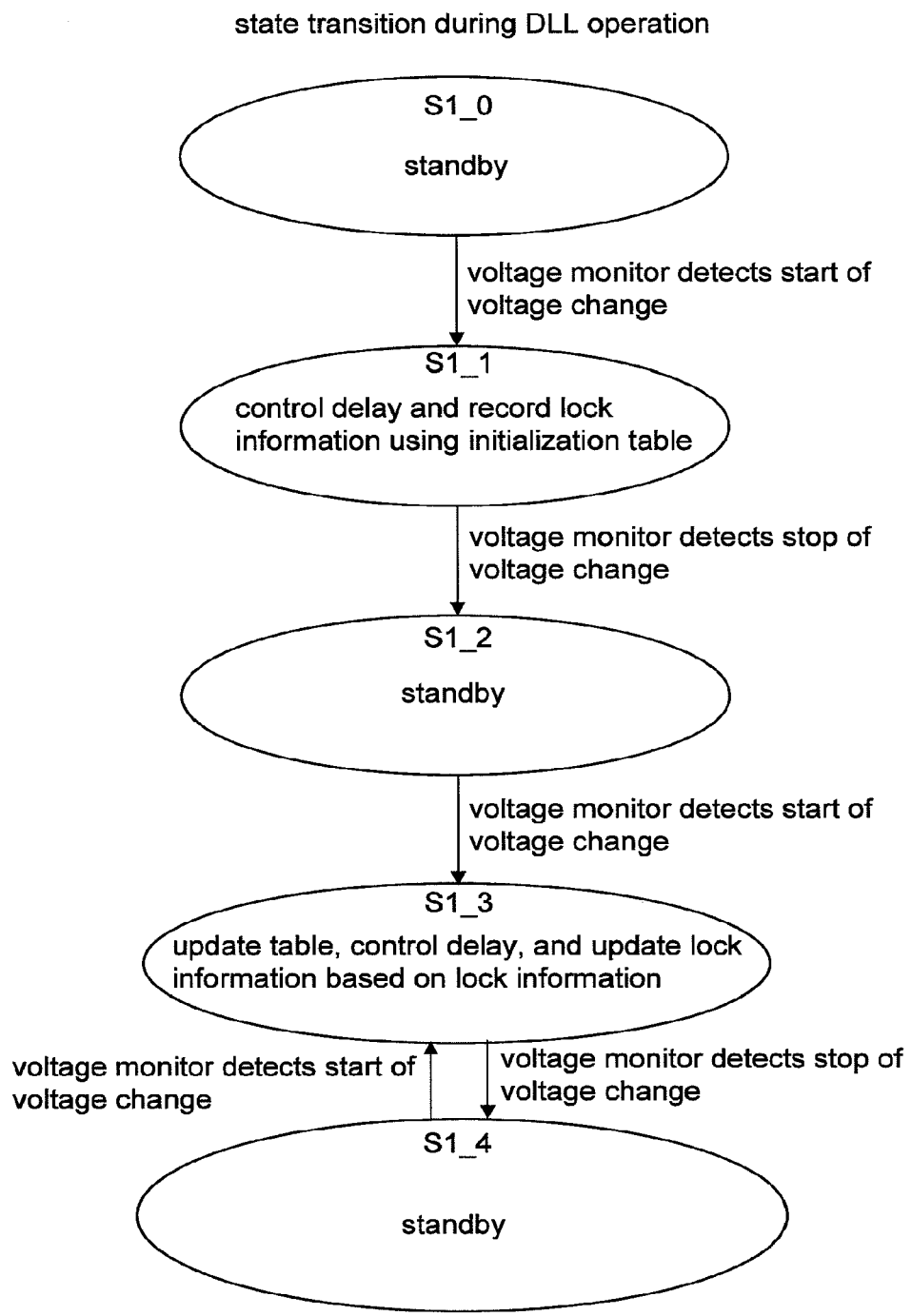
FIG. 27 is a state transition diagram concerning the embodiment described with reference to FIGS. 26A and 26B.

FIG. 27 shows a state transition diagram concerning the embodiment described with reference to FIGS. 26A and 26B. At initial state S1_0, the delay-locked loop circuit DLL goes standby. The delay-locked loop circuit DLL receives a trigger to start changing the voltage from the voltage information VVAL_3 and changes to state S1_1. The delay-locked loop circuit DLL receives a trigger to stop changing the voltage from the voltage information VVAL_3 and changes to state S1_2 to terminate the first calibration. The delay-locked loop circuit DLL re-receives a trigger to start changing the voltage from the voltage information VVAL_3 and changes to state S1_3. The delay-locked loop circuit DLL subsequently receives a trigger to start or stop changing the voltage and alternately changes to state S1_4 and state S1_3.

The skew adjustment function described in the invention is generally used between communicating modules. A module contains many clock paths. Comparing optimal paths with each other can improve the comparison accuracy. Two examples will be described below.

Figure 28A:
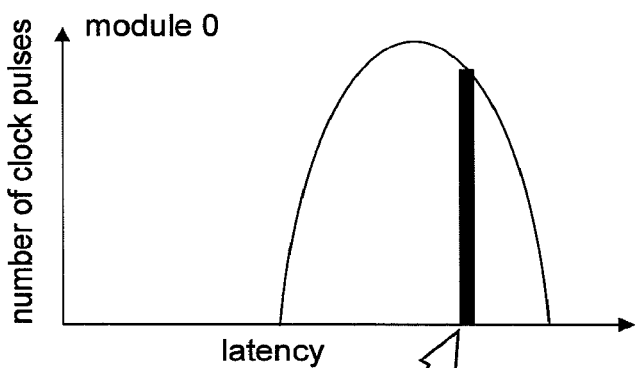
FIGS. 28A, 28B, and 28C are explanatory diagrams showing relation between clock paths on the delay-locked loop circuit DLL for reducing phase differences.
Figure 28B:
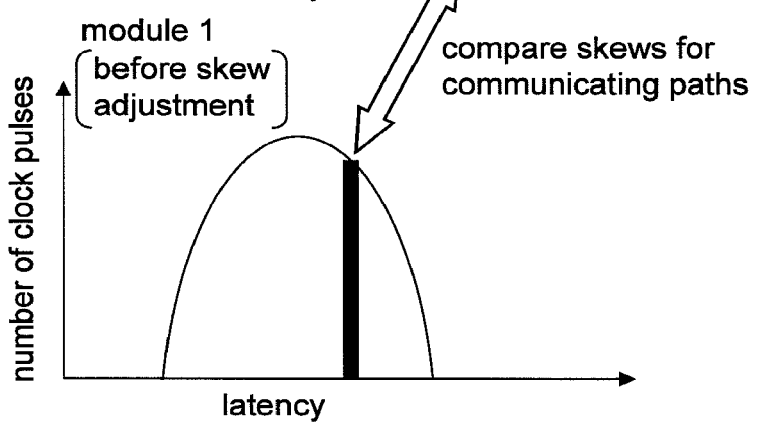
Figure 28C:
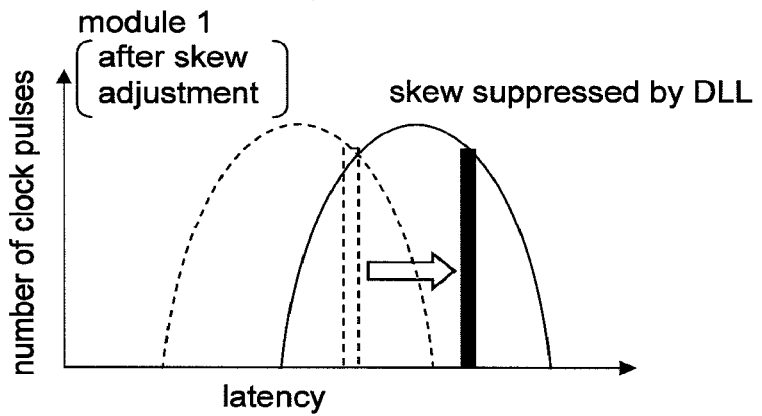

FIGS. 28A, 28B, and 28C show relation between clock paths on the delay-locked loop circuit DLL for reducing phase differences. FIGS. 28A, 28B, and 28C provide conceptual diagrams showing the latency and distribution of the number of paths up to flip-flops coupled to clock tree nodes in modules 0 and 1. A given skew exists between modules 0 and 1 (FIGS. 28A and 28B). The communication between the modules may be subject to restrictions such as a clock frequency decrease. To solve the problem, the delay-locked loop circuit DLL is coupled to paths having the same latency to minimize the skews. The latency distributions of the modules 0 and 1 can overlap with each other. This makes it possible to sufficiently decrease a skew between any flip-flops for the modules 0 and 1. The communication is available without decreasing a clock frequency between any flip-flops.

Figure 29A:
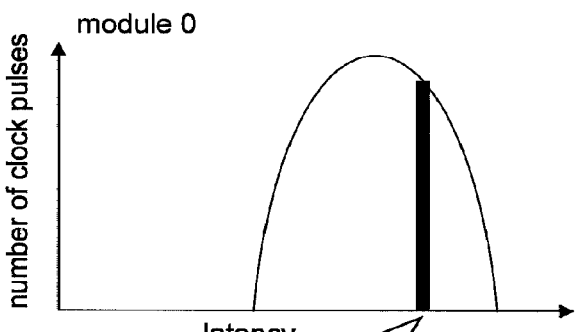
FIGS. 29A, 29B, and 29C are explanatory diagrams showing another relation between clock paths on the delay-locked loop circuit DLL for reducing phase differences.
Figure 29B:
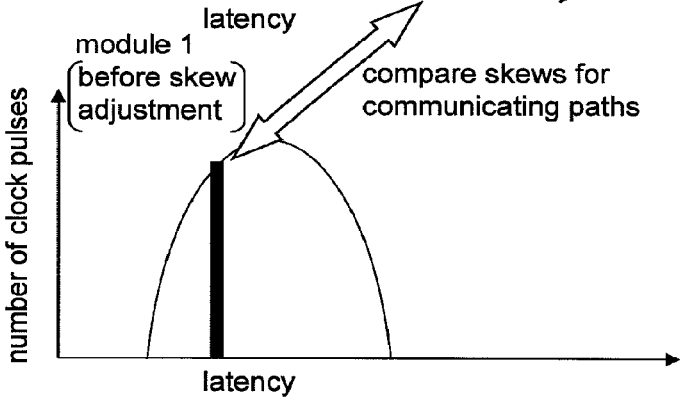
Figure 29C:
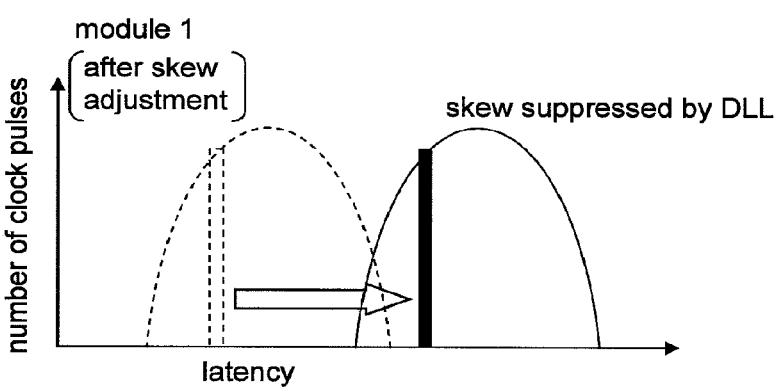

FIGS. 29A, 29B, and 29C show another relation between clock paths on the delay-locked loop circuit DLL for reducing phase differences. FIGS. 29A, 29B, and 29C provide conceptual diagrams showing the latency and distribution of the number of paths up to flip-flops coupled to clock tree nodes in modules 0 and 1. A given skew exists between modules 0 and 1 (FIGS. 29A and 29B). The communication between the modules may be subject to restrictions such as a clock frequency decrease. To solve the problem, the delay-locked loop circuit DLL is coupled to paths communicating with each other to minimize the skews. This makes it possible to minimize a clock skew between the modules 0 and 1. A sufficient timing margin is available. It is possible to prevent the data transfer clock frequency from decreasing but also provide a high-speed data transfer clock.

What is claimed is:

1. A semiconductor integrated circuit having a phase comparison circuit to compare a phase between first and second clocks provided with different signal amplitudes, wherein the phase comparison circuit uses the first clock as an activation signal for a differential input stage, differentially amplifies the second clock based on a reference voltage equivalent to half a drive voltage for the second clock, and senses and latches a differential amplification result, comprising:

a first circuit using a first power-supply voltage for operation and a second circuit using a second power-supply voltage for operation, wherein the semiconductor integrated circuit uses a comparison result from the phase comparison circuit, performs clock delay adjustment between a path for transmitting a clock to the first circuit and a path for transmitting a clock to the second circuit along a clock tree for transmitting a clock to the first circuit and the second circuit, and synchronizes both clocks.

2. The semiconductor integrated circuit according to claim 1, further comprising:

a level converting circuit provided along a signal line for information transmission between the first and second circuits, wherein the level converting circuit comprises a clocked inverter circuit and a latch circuit, the clocked inverter circuit having an output terminal coupled to an input terminal of the latch circuit, wherein the clocked inverter circuit comprises a series circuit having a pair of p-channel MOS transistors and a pair of n-channel MOS transistors, wherein a signal is input to a common gate of one p-channel MOS transistor and one n-channel MOS transistor, a clock signal is supplied to a gate of the other p-channel MOS transistor, and an inverted clock signal of that clock signal is supplied to a gate of the other n-channel MOS transistor, and wherein the latch circuit is latched in accordance with a cutoff state of the other p-channel MOS transistor and n-channel MOS transistor.

* * * * *